(12) United States Patent
Tayli et al.

(10) Patent No.: US 12,007,455 B2
(45) Date of Patent: *Jun. 11, 2024

(54) TENSOR FIELD MAPPING WITH MAGNETOSTATIC CONSTRAINT

(71) Applicant: Q Bio, Inc., San Carlos, CA (US)

(72) Inventors: Doruk Tayli, Mountain View, CA (US); Stamatis Lefkimmiatis, Attiki (GR); Athanasios Polymeridis, Salonika (GR)

(73) Assignee: Q Bio, Inc., San Carlos, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 17/832,200

(22) Filed: Jun. 3, 2022

(65) Prior Publication Data

US 2022/0308136 A1  Sep. 29, 2022

Related U.S. Application Data

(63) Continuation of application No. 16/447,080, filed on Jun. 20, 2019, now Pat. No. 11,360,166, which is a
(Continued)

(51) Int. Cl.
*G01R 33/30* (2006.01)
*G01R 33/36* (2006.01)
(Continued)

(52) U.S. Cl.
CPC ............ *G01R 33/30* (2013.01); *G01R 33/36* (2013.01); *G01R 33/443* (2013.01); *G01R 33/54* (2013.01)

(58) Field of Classification Search
CPC ...... G01R 33/30; G01R 33/36; G01R 33/443; G01R 33/54; G01R 33/5608
See application file for complete search history.

(56) References Cited

U.S. PATENT DOCUMENTS 4,729,892 A  3/1988 Beall
5,486,762 A  1/1996 Freedman et al.
(Continued)

FOREIGN PATENT DOCUMENTS

CN  102947721 A  2/2013
CN  110140042 A  8/2019
(Continued)

OTHER PUBLICATIONS

"Drescher et al., article titled Longitudinal Screening Algorithm That Incorporates Change Over Time in CA125 Levels Identifies Ovarian Cancer Earlier Than a Single-Threshold Rule".
(Continued)

*Primary Examiner* — Steven W Crabb
(74) *Attorney, Agent, or Firm* — Aurora Consulting LLC

(57) ABSTRACT

A system may measure a response associated with a sample to an excitation. The system may compute, using the measured response and the excitation as inputs to an inverse model or a predetermined predictive model, model parameters on a voxel-by-voxel basis in a forward model with multiple voxels that represent the sample. The predetermined predictive model was trained using training data for different excitation strengths, different measurement conditions, or both. The forward model may simulate response physics occurring within the sample to a given excitation, and the model parameters may include magnetic susceptibilities of the multiple voxels. Moreover, the system may determine an accuracy of the model parameters by comparing at least the measured response and a calculated predicted value of the response using the forward model, the model parameters and the excitation. When the accuracy exceeds a predefined value, the system may provide the model parameters as an output.

20 Claims, 7 Drawing Sheets

Related U.S. Application Data continuation-in-part of application No. 16/277,939, filed on Feb. 15, 2019, now Pat. No. 11,354,586.

(51) Int. Cl.
  *G01R 33/44* (2006.01)
  *G01R 33/54* (2006.01)

(56) References Cited

U.S. PATENT DOCUMENTS

| | | |
|---|---|---|
| 5,619,138 A | 4/1997 | Rourke |
| 5,793,210 A | 8/1998 | Pla |
| 5,865,177 A | 2/1999 | Segawa |
| 6,084,408 A | 7/2000 | Chen |
| 6,148,272 A | 11/2000 | Bergstrom |
| 6,392,409 B1 | 5/2002 | Chen |
| 6,528,998 B1 | 3/2003 | Maier |
| 6,605,942 B1 | 8/2003 | Warren |
| 6,678,669 B2 | 1/2004 | Lapointe |
| 7,423,430 B1 | 9/2008 | Sharif et al. |
| 7,576,538 B2 | 8/2009 | Meersmann |
| 7,924,002 B2 | 4/2011 | Lu |
| 7,940,927 B2 | 5/2011 | Futa |
| 7,974,942 B2 | 7/2011 | Pomroy |
| 8,078,554 B2* | 12/2011 | Fung ............... G06N 7/01 706/45 |
| 8,108,311 B2 | 1/2012 | Herlitz |
| 8,427,157 B2 | 4/2013 | Franz |
| 8,432,165 B2 | 4/2013 | Weiger Senften |
| 8,502,532 B2 | 8/2013 | Assmann |
| 8,686,727 B2 | 4/2014 | Reddy |
| 8,723,518 B2 | 5/2014 | Seiberlich |
| 8,736,265 B2 | 5/2014 | Boernert |
| 9,046,589 B2 | 6/2015 | Gjesdal |
| 9,103,896 B2 | 8/2015 | Gross |
| 9,192,322 B2 | 11/2015 | Jia |
| 9,513,359 B2 | 12/2016 | Koch |
| 9,514,169 B2 | 12/2016 | Mattsson |
| 9,958,521 B2 | 5/2018 | Gettings |
| 9,977,106 B2 | 5/2018 | Holger |
| 10,132,699 B1 | 11/2018 | Langlois |
| 10,132,899 B2 | 11/2018 | Yoshitaka |
| 10,402,910 B1 | 9/2019 | Kunz et al. |
| 10,571,542 B2 | 2/2020 | Sbrizzi et al. |
| 2001/0043068 A1 | 11/2001 | Lee |
| 2002/0155587 A1 | 10/2002 | Opalsky |
| 2002/0177771 A1 | 11/2002 | Guttman |
| 2003/0210043 A1 | 11/2003 | Freedman |
| 2004/0266442 A1 | 12/2004 | Albert |
| 2005/0054914 A1 | 3/2005 | Lewin |
| 2005/0096534 A1 | 5/2005 | Dumoulin |
| 2005/0137476 A1 | 6/2005 | Weiland |
| 2005/0181466 A1 | 8/2005 | Dambinova |
| 2005/0251023 A1 | 11/2005 | Kannengiesser et al. |
| 2008/0065665 A1 | 3/2008 | Pomroy |
| 2008/0081375 A1 | 4/2008 | Tesiram |
| 2008/0082834 A1 | 4/2008 | Mattsson |
| 2008/0129298 A1 | 6/2008 | Olson |
| 2008/0197844 A1 | 8/2008 | Ying |
| 2008/0292194 A1 | 11/2008 | Russell |
| 2009/0240138 A1 | 9/2009 | Yi |
| 2009/0315561 A1 | 12/2009 | Assmann |
| 2010/0131518 A1 | 5/2010 | Elteto |
| 2010/0141252 A1 | 6/2010 | Schmitt |
| 2010/0142823 A1 | 6/2010 | Wang |
| 2010/0177188 A1 | 7/2010 | Kishima |
| 2010/0189328 A1 | 7/2010 | Boernert |
| 2010/0244827 A1 | 9/2010 | Hennel |
| 2010/0256496 A1 | 10/2010 | Zhu |
| 2010/0306854 A1 | 12/2010 | Neergaard |
| 2011/0004071 A1 | 1/2011 | Faiola et al. |
| 2011/0044524 A1 | 2/2011 | Wang |
| 2011/0093243 A1 | 4/2011 | Tawhai |
| 2011/0095759 A1 | 4/2011 | Bhattacharya |
| 2011/0166484 A1 | 7/2011 | Virta |
| 2011/0254549 A1 | 10/2011 | Lin |
| 2012/0124161 A1 | 5/2012 | Tidwell |
| 2012/0177128 A1 | 7/2012 | Elad |
| 2012/0223707 A1* | 9/2012 | Gross ............... G01R 33/5612 324/318 |
| 2012/0271157 A1 | 10/2012 | Guo |
| 2013/0099786 A1 | 4/2013 | Huang |
| 2013/0271133 A1 | 10/2013 | Moeller |
| 2013/0275718 A1 | 10/2013 | Ueda |
| 2013/0294669 A1 | 11/2013 | El-Baz |
| 2013/0338930 A1 | 12/2013 | Senegas |
| 2014/0039300 A1 | 2/2014 | Kjell-Inge |
| 2014/0062475 A1 | 3/2014 | Koch |
| 2014/0107469 A1 | 4/2014 | Gjesdal |
| 2014/0336998 A1 | 11/2014 | Cecchi |
| 2015/0002149 A1 | 1/2015 | Eggers |
| 2015/0003706 A1 | 1/2015 | Eftestøl |
| 2015/0032421 A1 | 1/2015 | Dean |
| 2015/0040225 A1 | 2/2015 | Coates |
| 2015/0070013 A1 | 3/2015 | Schmidt |
| 2015/0089574 A1 | 3/2015 | Mattsson |
| 2015/0370904 A1 | 12/2015 | Joshi et al. |
| 2016/0007968 A1 | 1/2016 | Sinkus |
| 2016/0077182 A1 | 3/2016 | Wang |
| 2016/0127123 A1 | 5/2016 | Johnson |
| 2016/0166209 A1 | 6/2016 | Sharma |
| 2017/0003365 A1 | 1/2017 | Rosen |
| 2017/0007148 A1 | 1/2017 | Stevens |
| 2017/0011255 A1 | 1/2017 | Stevens |
| 2017/0011514 A1 | 1/2017 | Westerhoff |
| 2017/0038452 A1 | 2/2017 | Trzasko |
| 2017/0123029 A1 | 5/2017 | Bhat et al. |
| 2017/0285122 A1 | 10/2017 | Ramaswamy |
| 2017/0285123 A1 | 10/2017 | Kaditz et al. |
| 2018/0120402 A1 | 5/2018 | Nehrke |
| 2018/0217073 A1 | 8/2018 | Zhao |
| 2018/0238983 A1 | 8/2018 | Cohen |
| 2018/0321347 A1* | 11/2018 | Wang ............... G06T 7/0012 |
| 2019/0294992 A1 | 9/2019 | Zhu |
| 2019/0383889 A1 | 12/2019 | Yu |
| 2020/0026967 A1 | 1/2020 | Lu |
| 2020/0085382 A1 | 3/2020 | Taerum |
| 2020/0249300 A1 | 7/2020 | Peng |
| 2020/0249302 A1 | 8/2020 | Van Den Brink |
| 2020/0264249 A1 | 8/2020 | Tayli et al. |
| 2020/0289019 A1 | 9/2020 | Sacolick |
| 2020/0319283 A1 | 10/2020 | Wang |
| 2021/0096203 A1 | 4/2021 | Fernandez Villena et al. |
| 2022/0163611 A1 | 5/2022 | Van Der Heide et al. |
| 2022/0236358 A1 | 7/2022 | Bernstein |
| 2022/0326330 A1 | 10/2022 | Farman |
| 2023/0044166 A1 | 2/2023 | Liu et al. |

FOREIGN PATENT DOCUMENTS

| | | |
|---|---|---|
| EP | 1953580 | 9/2014 |
| EP | 15001457.9 | 5/2015 |
| EP | 15020075.6 | 5/2015 |
| EP | 15171708.9 | 6/2015 |
| EP | 3093677 | 11/2016 |
| EP | 3093677 A1 | 11/2016 |
| JP | 2013029499 | 2/2013 |
| WO | 2014047326 | 3/2014 |
| WO | 2014205275 | 12/2014 |
| WO | 2015183792 | 12/2015 |
| WO | 2016073985 | 5/2016 |
| WO | 2016184779 A1 | 11/2016 |
| WO | 2017007663 A1 | 1/2017 |
| WO | 2017210225 | 12/2017 |
| WO | 2022106299 A1 | 5/2022 |

OTHER PUBLICATIONS

"G. Schultz, "Magnetic Resonance Imaging with Nonlinear Gradient Fields: Signal Encoding and Image Reconstruction" Springer Verlag, New York, 2013), Chapter 2, pp. 1-10."

(56) References Cited

OTHER PUBLICATIONS

"Gualda et al. SPIM-fluid: open source light-sheet based platform for high-throughput imaging. Biomed Opt Express (Nov. 1, 2015} vol. 6, No. 11, pp. 4447-4456, p. 4448 para 2-3, p. 4450, para 2".

"Hasenkam et al., "Prosthetic Heart Valve Evaluation by Magnetic Resonance Imaging," European Journal of Cardio-thoracic Surgery 16 (1999) 300-305", 300-305.

"Huttunen et al. "Solving Maxwell's equations using the ultra weak variational formulation." In: 1-32 Journal of Computational Physics. Jan. 18, 2006 (Jan. 18, 2006) Retrieved on Nov. 16, 2020 (Nov. 16, 2020) from <http://www.waveller.com/Waveller_Acoustics/publicationsfmaxwell_uwvf.pdf> entire document".

"I. Kononenko "Machine learning for medical diagnosis: history, state of the art and perspective" Artificial Intelligence in Medicine 23 (2001) 21 pgs".

"International Application Serial No. PCT/US2016/040215, International Preliminary Report on Patentability and Written Opinion mailed Jan. 9, 2018".

"International Application Serial No. PCT/US2016/040215, International Search Report mailed Sep. 19, 2016", 2 pgs.

"International Application Serial No. PCT/US2016/040215, Written Opinion mailed Sep. 19, 2016", 9 pgs.

"International Application Serial No. PCT/US2016/040578, International Search Report mailed Sep. 19, 2016", 2 pgs.

"International Application Serial No. PCT/US2016/040578, Written Opinion mailed Sep. 19, 2016", 9 pgs.

"International Application Serial No. PCT/US2016/051204, International Search Report mailed Nov. 28, 2016", 2 pgs.

"International Application Serial No. PCT/US2016/051204, Written Opinion mailed Nov. 28, 2016", 10 pgs.

"International Application Serial No. PCT/US2017/022842, International Search Report mailed May 23, 2017", 2 pgs.

"International Application Serial No. PCT/US2017/022842, Written Opinion mailed on May 23, 2017", 4 pgs.

"International Application Serial No. PCT/US2017/022911, International Search Report mailed Jul. 19, 2017", 4 pgs.

"International Application Serial No. PCT/US2017/022911, Written Opinion mailed Jul. 19, 2017", 10 pgs.

"International Application Serial No. PCT/US2017/035071, International Search Report mailed Aug. 22, 2017", 2 pgs.

"International Application Serial No. PCT/US2017/035071, Written Opinion mailed Aug. 22, 2017", 7 pgs.

"International Application Serial No. PCT/US2017/035073, International Search Report mailed Aug. 11, 2017", 2 pgs.

"International Application Serial No. PCT/US2017/035073, Written Opinion mailed Aug. 11, 2017", 6 pgs.

"International Application Serial No. PCT/US2021/057136, International Search Report mailed Feb. 2, 2022".

"International Application Serial No. PCT/US2021/057136, Written Opinion mailed Feb. 2, 2022".

"International Search Report mailed Feb. 24, 2021 in International Application No. PCT/US2020/052717, 2 pgs".

"Kwan et al: "MRI Simulation-Based Evaluation of Image-Processing and Classification Methods" IEEE Transactions on Medical Imaging. vol. 18 No. 11, Nov. 1999,", 13 pgs.

"Nestares et al., "Robust Multiresolution Alignment of MRI Brain Volumes," Magnetic Resonance in Medicine 43:705-715 (2000)", 705-715.

"Siemens. Magnetic Resonance Imaging. (Dec. 2012) [retrieved on Jun. 27, 2017, https://w5.siemens.com/web/ua/ru/medecine/detection_diagnosis/magnetic_resonans/035-15-MRI-scaners/Documents/mri-magnetom-family_brochure-00289718.pdf] p. 6-8, 13, 15-16".

"Thiesson Julien et al., "3D linear inversion of magnetic susceptibility data acquired by frequency domain EMI," Journal of Applied Geophysics (Year: 2016)".

"Vargas et al. "Object detection on compressive measurements using correlation filters and 1-20 sparse representation." Sep. 3, 2018 (Sep. 3, 2018) Retrieved on Dec. 31, 2021 (Dec. 31, 2021) from <https://ieeexplore.ieee.org/abstractldocument/8553312> entire document; 5 pages".

"Written Opinion mailed Feb. 24, 2021 in International Application No. PCT/US2020/052717, 5 pgs".

"Ying et al. "Joint image reconstruction and sensitivity estimation in SENSE (JSENSE)." In: 1-32 Magnetic Resonance in Medicine: An Official Journal of the International Society for Magnetic Resonance in Medicine. Feb. 21, 2007 (Feb. 21, 2007) Retrieved on Nov. 16, 2020(Nov. 16, 2020) from <https://onlinelibrary.wiley.com/doi/pdf/10.1002/mrm.21245> entire document".

"Cohen Ouri et al, "Deep learning for fast MR Fingerprinting Reconstruction", Proc. Inti. Soc. Mag. Reson. Med. 25, Apr. 7, 2017".

"Elisabeth Hoppe et al: Magnetic Resonance Fingerprinting: A New Approach for Predicting Quantitative Parameter Values from Time Series", German Medical Data Sciences: Visions and Bridges (62. Jahrestagung der GMDS), Sep. 17, 2017, pp. 202-206; Retrieved from the Internet: URL:https://www5.informatik.uni-erlangen.de/Forschung/Pub likationen/2017 /Hoppel7-DLF.pdf [retrieved on Dec. 11, 2018].

"European Application No. 20756501.1, European Extended Search Report mailed Oct. 20, 2022, 13 pages".

"Hoppe Elisabeth et al: "Deep Learning for Magnetic Resonance Fingerprinting: Accelerating the Reconstruction of Quantitative Relaxation Maps", Proc. Inti. Soc. Mag. Reson. Med. 26 (2018), Jun. 1, 2018 Retrieved from the Internet: URL:https://cds.ismrm.org/protected/18MProceedings/PDFfiles/2791 .html [retrieved on Oct. 8, 2022]".

"International Application Serial No. PCT/US2022/029055, International Search Report mailed Aug. 30, 2022, 2 pages".

"International Application Serial No. PCT/US2022/029055, Written Opinion mailed Aug. 30, 2022, 6 pages".

"Ouri Cohen et al, "MR fingerprinting Deep Reconstruction NEtwork (Drone)", arxiv.org, Cornell University Library, 201 Olin Library Cornell University Ithaca, NY 14853, Oct. 15, 2017".

"Patrick Virtue et al: Complex-valued Neural Nets for MRI Fingerprinting, arxiv.org, Cornell University Library, 201 Olin Library Cornell University Ithaca, NY 14853, Jul. 1, 2017".

"Ohliger et al., "Fundamental Physical Constraints on the Performance of Parallel Magnetic Resonance Imaging", International Society for Magnetic Resonance in Medicine, May 3, 2002 (May 3, 2002), p. 2387, XP040587120".

"Martin Uecker et al: "Image reconstruction by regularized nonlinear inversion—Joint estimation of coil sensitivities and image content", Magnetic Resonance in Medicine, vol. 60, No. 3, Aug. 5, 2008 (Aug. 5, 2008) , pp. 674-682, XP055007514, ISSN: 0740-3194, DOI: 10.1002/mrm.21691".

"Martin Uecker et al: "Epirit—an eigenvalue approach to autocalibrating parallel MRI: Where Sense meets GRAPPA", Magnetic Resonance in Medicine, vol. 71, No. 3, May 6, 2013 (May 6, 2013), pp. 990-1001, XP055357609, US ISSN: 0740-3194, DOI: 10.1002/mmm.24751".

"International Application Serial No. PCT/US2022/029055, International Preliminary Report on Patentability and Written Opinion mailed Jan. 4, 2024; 7 pages".

"European Application No. 20867684.1, European Extended Search Report mailed Sep. 28, 2023, 9 pages".

"Cohen O. et al., MR fingerprinting Deep Reconstruction NEtwork (Drone). Magn Reson Med., Sep. 30, 2018, vol. 80, No. 3, pp. 885-894 Whole document Citation not enclosed due to copyright restrictions."

"Christian M Holme H et al: "ENLIVE: An Efficient Nonlinear Method for Calibrationless and Robust Parallel Imaging", arxiv.org, Cornell University Library, 201 Olin Library Cornell University Ithaca, NY 14853, Jun. 29, 2017 (Jun. 29, 2017), XP080773543".

\* cited by examiner

TENSOR FIELD MAPPING WITH MAGNETOSTATIC CONSTRAINT

CROSS-REFERENCE TO RELATED APPLICATION

This application is a continuation of U.S. Non-Provisional application Ser. No. 16/447,080, entitled "Tensor Field Mapping with Magnetostatic Constraint." filed on Jun. 20, 2019; which is a continuation-in-part of U.S. Non-Provisional application Ser. No. 16/277,939, entitled "Model Parameter Determination Using a Predictive Model," filed on Feb. 15, 2019, the contents of each of which are hereby incorporated by reference.

BACKGROUND

Field

The described embodiments relate generally to determining model parameters associated with a sample for use in a forward model that simulates response physics of the sample to an excitation.

Related Art

Many non-invasive characterization techniques are available for determining one or more physical parameters of a sample. For example, magnetic properties can be studied using magnetic resonance or MR (which is often referred to as 'nuclear magnetic resonance' or NMR), a physical phenomenon in which nuclei in a magnetic field absorb and re-emit electromagnetic radiation. Moreover, density variations and short or long-range periodic structures in solid or rigid materials can be studied using characterization techniques such as x-ray imaging, x-ray diffraction, computed tomography, neutron diffraction or electron microscopy, in which electromagnetic waves or energetic particles having small de Broglie wavelengths are absorbed or scattered by the sample. Furthermore, density variations and motion in soft materials or fluids can be studied using ultrasound imaging, in which ultrasonic waves are transmitted and reflected in the sample.

In each of these and other non-invasive characterization techniques, one or more external excitations (such as a flux of particles or incident radiation, static or time-varying scalar fields, and/or static or time-varying vector fields) are applied to the sample, and a resulting response of the sample, in the form a physical phenomenon, is measured to, directly or indirectly, determine the one or more physical parameters. As an example, in MR magnetic nuclear spins may be partially aligned (or polarized) in an applied external DC magnetic field. These nuclear spins may precess or rotate around the direction of the external magnetic field at an angular frequency (which is sometimes referred to as the 'Larmor frequency') given by the product of a gyromagnetic ratio of a type of nuclei and the magnitude or strength of the external magnetic field. By applying a perturbation to the polarized nuclear spins, such as one or more radio-frequency (RF) pulses (and, more generally, electro-magnetic pulses) having pulse widths corresponding to the angular frequency and at a right-angle or perpendicular to the direction of the external magnetic field, the polarization of the nuclear spins can be transiently changed. The resulting dynamic response of the nuclear spins (such as the time-varying total magnetization) can provide information about the physical and material properties of a sample, such as one or more physical parameters associated with the sample.

Moreover, in general, each of the characterization techniques may allow one or more physical parameters to be determined in small volumes or voxels in a sample, which can be represented using a tensor. Using magnetic resonance imaging (MRI) as an example, the dependence of the angular frequency of precession of nuclear spins (such as protons or the isotope $^1H$) on the magnitude of the external magnetic field can be used to determine images of three-dimensional (3D) or anatomical structure and/or the chemical composition of different materials or types of tissue. In particular, by applying a non-uniform or spatially varying magnetic field to a sample, the resulting variation in the angular frequency of precession of $^1H$ spins is typically used to spatially localize the measured dynamic response of the $^1H$ spins to voxels, which can be used to generate images, such as of the internal anatomy of a patient.

However, the characterization of the physical properties of a sample is often time-consuming, complicated and expensive. For example, acquiring MR images in MRI with high-spatial resolution (i.e., small voxels sizes) often involves a large number of measurements (which are sometimes referred to as 'scans') to be performed for time durations that are longer than the relaxation times of the $^1H$ spins in different types of tissue in a patient. Moreover, in order to achieve high-spatial resolution, a large homogenous external magnetic field is usually used during MRI. The external magnetic field is typically generated using a superconducting magnet having a toroidal shape with a narrow bore, which can feel confining to many patients. Furthermore, Fourier transform techniques may be used to facilitate image reconstruction, at the cost of constraints on the RF pulse sequences and, thus, the MR scan time.

The combination of long MR scan times and, in the case of MRI, the confining environment of the magnet bore can degrade the user experience. In addition, long MR scan times reduce throughput, thereby increasing the cost of performing the characterization. These types of problems can constrain or limit the use of many characterization techniques.

One approach for addressing these problems is to use simulations of the response physics of a sample to one or more excitations to determine information, such as the one or more physical parameters. For example, using model parameters at the voxel level and a forward model based on one or more differential equations that describe a physical phenomenon, a computer can simulate the response physics of the sample as an output of the forward model using information specifying the one or more excitations as an input to the forward model.

However, this approach often replaces the problems of having a large number of MR scans and long MR scan times, with the problems associated with accurately determining the model parameters at the voxel level. For example, the model parameters are typically determined by iteratively applying one or more excitations, performing measurements and then solving an inverse problem of using the measurements to compute the corresponding model parameters until a desired accuracy of the simulated response physics is achieved (which is sometimes referred to as an 'iterative approach'). In general, it can be difficult, time-consuming and expensive to determine the model parameters using these existing techniques, which may constrain or limit the use of simulations of the response physics to characterize a sample.

SUMMARY

A system that determines model parameters associated with a sample is described. This system includes: a source that provides an excitation; a measurement device that performs measurements; a processor that executes program instructions; and memory that stores the program instructions. During operation, the system may apply, to the sample, the excitation using the source, where the excitation includes an external magnetic field and a radio-frequency wave. Then, the system may measure, using the measurement device, a response associated with the sample to the excitation. Moreover, the system may use the measured response and information specifying the excitation as inputs to one of an inverse model and a predetermined predictive model, the model parameters on a voxel-by-voxel basis in a forward model with multiple voxels that represent the sample, where the forward model simulates response physics occurring within the sample to the excitation, and the model parameters include magnetic susceptibilities of the multiple voxels. Note that the forward model may be a function of the excitation, the model parameters of the multiple voxels, and differential or phenomenological equations that approximates the response physics. Furthermore, the system may determine, using the processor, an accuracy of the model parameters by comparing at least the measured response and a calculated predicted value of the response using the forward model, the model parameters and the excitation. Additionally, the system may provide, when the accuracy exceeds a predefined value, the model parameters as an output to a user, to another electronic device, to a display or to memory.

Note that the predetermined predictive model may include a machine-learning model and/or a neural network.

Moreover, the inverse model and the forward model may include a magneto-static simulator that simulates perturbations to the external magnetic field associated with the magnetic susceptibilities of the multiple voxels. For example, the magneto-static simulator may compute a solution to an integral equation, such as by using a method of moments. In some embodiments, the magnetic susceptibilities of the multiple voxels are initially assumed to have a constant value and the magneto-static simulator may compute the solution using a Fourier transform.

Furthermore, the magnetic susceptibilities of the multiple voxels may include absolute susceptibilities that are computed without use of a reference material.

Additionally, a subset of the model parameters may be associated with spin dynamics and magnetic susceptibilities of the multiple voxels may be used to regularize the spin dynamics in the computing operation.

Note that the magnetic susceptibilities of the multiple voxels may reduce or eliminate artifacts in a remainder of the model parameters that are associated with the magnetic susceptibilities.

Moreover, the inverse model may include an iterative measurement and analysis technique.

Furthermore, the source may be associated with a magnetic-resonance apparatus.

Additionally, the measured response may include a time-domain response of the sample and may be other than an image.

Another embodiment provides a computer-readable storage medium for use with the system. This computer-readable storage medium includes a program module that, when executed by the system, causes the system to perform at least some of the aforementioned operations.

Another embodiment provides a method for determining the model parameters associated with the sample. This method includes at least some of the aforementioned operations performed by the system.

This Summary is provided for purposes of illustrating some exemplary embodiments, so as to provide a basic understanding of some aspects of the subject matter described herein. Accordingly, it will be appreciated that the above-described features are simply examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
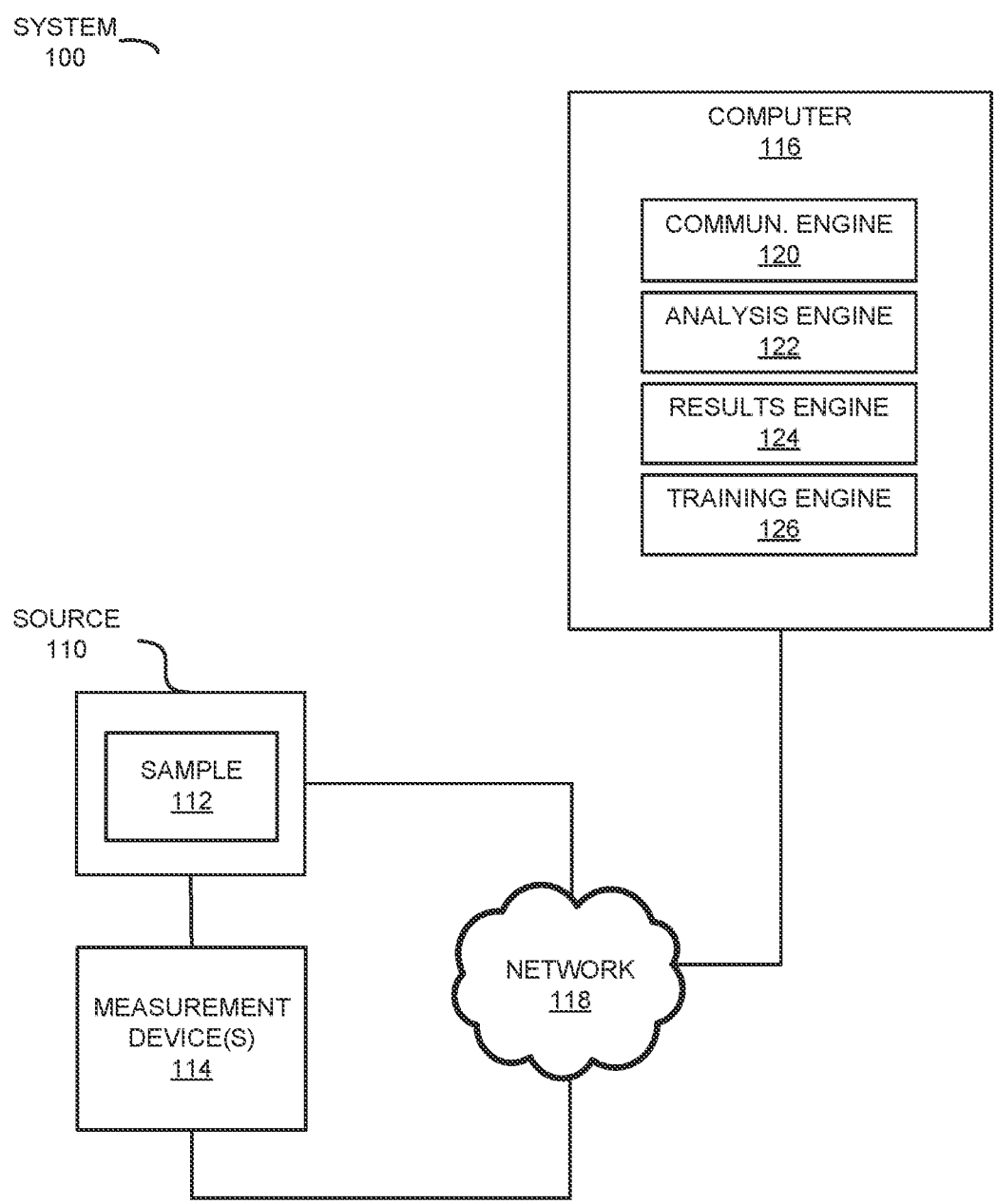
FIG. 1 is a block diagram illustrating an example of a system in accordance with an embodiment of the present disclosure.

A system that determines model parameters associated with a sample is described. During operation, the system may measure, using a measurement device, a response associated with a sample to an excitation. Then, the system may compute, using the measured response and the excitation as inputs to one of an inverse model and a predetermined predictive model, model parameters on a voxel-by-voxel basis in a forward model with multiple voxels that represent the sample. The forward model may simulate response physics occurring within the sample to a given excitation, and the model parameters may include magnetic susceptibilities of the multiple voxels. Moreover, the system may determine an accuracy of the model parameters by comparing at least the measured response and a calculated predicted value of the response using the forward model, the model parameters and the excitation. When the accuracy exceeds a predefined value, the system may provide the model parameters as an output to: a user, another electronic device, a display, and/or a memory.

By determining the model parameters for voxels in the sample (which is sometimes referred to as 'tensor field mapping' or TFM, because the parameters in the voxels can be represented by a hybrid tensor, which may include or represent multiple scalar and/or vector values having different dimensionality, as opposed to a true tensor for a vector field), this computation technique may reduce or eliminate artifacts in the model parameters that are associated with the magnetic susceptibilities of the multiple voxels. Moreover, the computation technique may, in some embodiments, reduce or eliminate the need for iterative measurements and adaptation when determining the model parameters. Consequently, the computation technique may significantly reduce the use of system resources (such as processor time, memory, etc.) when determining the model parameters. Moreover, if the accuracy is insufficient (such as when the accuracy is less than the predefined value), the computation technique may be used to guide a modification to the excitation to facilitate rapid convergence on the model parameters with the desired accuracy. Furthermore, by providing a forward model that predicts a physical phenomenon based on the determined model parameters for a range of excitation values or intensities, the computation technique may facilitate rapid and accurate characterization of a sample (such as the determination of one or more physical parameters of a sample). Therefore, the computation technique can be used to dynamically adapt or modify the excitation used in the measurements and/or may facilitate improved sample characterization.

These capabilities may result in shorter MR scan or measurement times, increased throughput and, thus, reduced measurement cost, an improved user experience (such as by reducing the amount of time people spend in the confining environment of a magnet bore in an MR scanner), and increased use of characterization techniques. In addition, the computation technique may facilitate quantitative analysis of measurements, which may improve the accuracy, may reduce errors and, thus, may improve the health and well-being of people.

In general, the computation technique may be used in conjunction with a variety of characterization techniques and forward models that quantitatively simulate the response physics occurring within the sample to a given excitation. For example, the characterization technique may involve: x-ray measurements (such as x-ray imaging, x-ray diffraction or computed tomography), neutron measurements (neutron diffraction), electron measurements (such as electron microscopy or electron spin resonance), optical measurements (such as optical imaging or optical spectroscopy that determines a complex index of refraction at one or more wavelengths), infrared measurements (such as infrared imaging or infrared spectroscopy that determines a complex index of refraction at one or more wavelengths), ultrasound measurements (such as ultrasound imaging), proton measurements (such as proton scattering), MR measurements or an MR technique (such as MRI, MR spectroscopy or MRS with one or more types of nuclei, magnetic resonance spectral imaging or MRSI, MR elastography or MRE, MR thermometry or MRT, magnetic-field relaxometry, diffusion-tensor imaging and/or another MR technique, e.g., functional MRI, metabolic imaging, molecular imaging, blood-flow imaging, etc.), impedance measurements (such as electrical impedance at DC and/or an AC frequency) and/or susceptibility measurements (such as magnetic susceptibility at DC and/or an AC frequency). Therefore, the excitation may include at least one of: an electromagnetic beam in an x-ray band of wavelengths (such as between 0.01 and 10 nm), a neutron beam, an electron beam, an electromagnetic beam in an optical band of wavelengths (such as between 300 and 800 nm), an electromagnetic beam in an infrared band of wavelengths (such as between 700 nm and 1 mm), a sound wave in an ultrasound band of wavelengths (such as between 0.2 and 1.9 mm), a proton beam, an electric field associated with an impedance measurement device, a radio-frequency wave associated with an MR apparatus or scanner, and/or a magnetic field associated with a susceptibility measurement device. However, another non-invasive characterization technique (such as positron emission spectroscopy), an integrated therapy (such as proton beam therapy or proton implantation, radiation therapy, magnetically guided nano particles, etc.) and/or a different range of wavelengths (such as ultraviolet wavelengths between 10 and 400 nm) may be used. In general, the computation technique may be used with a wide variety of excitations to 'excite' a region of space as long as there is a forward model that describes the response physics for these excitations. In the discussion that follows, an MR technique is used as an illustrative example of a characterization technique.

Note that the sample may include an organic material or an inorganic material. For example, the sample may include: an inanimate (i.e., non-biological) sample, a biological life-form (such as a person or an animal, i.e., an in-vivo sample), or a tissue sample from an animal or a person (i.e., a portion of the animal or the person). In some embodiments, the tissue sample was previously removed from the animal or the person. Therefore, the tissue sample may be a pathology sample (such as a biopsy sample), which may be formalin fixed-paraffin embedded. In the discussion that follows, the sample is a person or an individual, which is used as an illustrative example.

We now describe embodiments of a system. FIG. 1 presents a block diagram illustrating an example of a system 100. In system 100, a source 110 selectively provides an excitation to a sample 112, and a measurement device 114 selectively performs measurements on sample 112 to measure a response of sample 112 to the excitation. Moreover, system 100 includes a computer 116. As described further below with reference to FIG. 7, computer 116 may include subsystems, such as a processing subsystem, a memory subsystem and a networking subsystem. For example, the processing subsystem may include a processor that executes program instructions, the memory subsystem may include a memory that stores the program instructions, and networking subsystem may include an interface that communicates instructions or commands to source 110 and measurement device 114 (such as one or more sensors), that receives measurements from measurement device 114, and that selectively provides determined model parameters.

During operation, a communication engine (or module) 120 in computer 116 may provide, via a network 118 (such as one or more wired and/or wireless links or interconnects), an instruction or a command to source 110, which may cause source 110 to apply, to sample 112, the excitation. This excitation may have at least a wavelength and an intensity or a flux. For example, the excitation may include: electromagnetic radiation, a radio-frequency wave, a particle beam, a sound wave, a magnetic field, and/or an electric field.

In some embodiments, the excitation may include an external magnetic field that polarizes one or more types of nuclei in sample 112, an optional gradient in the magnetic field, and/or a radio-frequency (RF) pulse sequence (which are sometimes referred to as 'measurement conditions' or 'scanning instructions'). Thus, source 110 may include a magnet that applies the external magnetic field, an optional gradient coil that applies the optional gradient, and/or an RF coil that applies the RF pulse sequence.

Then, communication engine 120 may provide, via network 118, an instruction or a command to measurement device 114, which may cause measurement device 114 to perform measurements of the response of at least a portion of sample 112 to the excitation. Moreover, measurement device 114 may provide, via network 118, the measurement results to communication engine 120. Note that measurement device 114 may include: an x-ray detector, a neutron detector, an electron detector, an optical detector, an infrared detector, an ultrasound detector, a proton detector, an MR apparatus or scanner, the impedance measurement device (such as a gel-covered table in an MR apparatus or scanner) and/or the susceptibility measurement device.

In some embodiments, measurement device 114 may include one or more RF pickup coils or another magnetic sensor (such as a magnetometer, a superconducting quantum interference device, opto-electronics, etc.) that measure time-varying or time-domain electrical signals corresponding to the dynamic behavior of nuclear spins in the one or more types of nuclei or at least an average component of the magnetization corresponding to the aggregate dynamic behavior of the nuclear spins (which is sometimes referred to as a 'magnetic response') of at least the portion of sample 112. For example, measurement device 114 may measure the transverse magnetization of at least a portion of sample 112 as it precesses in the xy plane.

Note that the measurements provided by measurement device 114 may be other than or different from an image. For example, the measurements may be other than MRI results. For example, the measurements may include or may correspond to (such as one or more components of) a free-induction-decay of the nuclear spins in sample 112. Consequently, in some embodiments the measurements may not involve performing a Fourier transform on the measured electrical signals (and, thus, may not be performed in k-space and may not involve pattern matching in k-space, such as MR fingerprinting). However, in general, the measurements may be specified in the time domain and/or the frequency domain. Therefore, in some embodiments, a variety of signal processing (such as filtering, image processing, etc.), noise cancellation and transformation techniques (such as a discrete Fourier transform, a Z transform, a discrete cosine transform, data compression, etc.) may be performed on the measurements.

After receiving the measurements, analysis engine (or module) 122 in computer 116 may analyze the measurements. This analysis may involve determining a (possibly time-varying) 3D position of sample 112 relative to measurement device 114 (which is sometimes referred to as '3D registration information'). For example, the aligning may involve performing point-set registration, such as with reference markers at known spatial locations. The registration may use a global or a local positioning system to determine changes in the position of sample 112 relative to measurement device 114. Alternatively or additionally, the registration may be based at least in part on variation in the Larmor frequency and the predetermined spatial magnetic-field inhomogeneity or variation in the magnetic field of source 110 and/or measurement device 112 (such as an MR apparatus or scanner). In some embodiments, the analysis involves aligning the voxels based at least in part on the registration information with desired voxel locations, and/or resampling and/or interpolating the measured signals to different voxel locations, which may facilitate subsequent comparisons with previous measurements or results.

Moreover, analysis engine 122 may use the measurements to determine model parameters for a forward model with multiple voxels that represent sample 112, and that simulates the response physics occurring in sample 112 to a given excitation in a range of possible excitations (i.e., the forward model may be more general than one that determines the predicted response to a particular or a specific excitation). Notably, with the appropriate model parameters for the voxels in sample 112, analysis engine 122 may use the forward model to accurately and quantitatively simulate or calculate a predicted response of sample 112 to the excitation (such as a predicted component of the magnetization). Note that the forward model may be based at least in part on or may use one or more differential equations or one or more phenomenological equations that approximates the response physics of sample 112 on a voxel-by-voxel basis. For example, the forward model may be based at least in part on or may use the Bloch equations, the Bloch-Torrey equations (thus, the forward model may include simulations of dynamics, such as motion associated with: respiration, a heartbeat, blood flow, mechanical motion, etc.), full Liouvillian computations (such as a Liouville supermatrix of interactions between two or more elements), a full Hamiltonian, Maxwell's equations (e.g., the forward model may calculate electrical and/or magnetic fields given electrical and/or magnetic excitations and sample 112 with specific magnetic and electrical properties of sample, such as a permittivity, a conductivity, a permeability, etc.), thermal diffusion equations, the Pennes (bioheat) equations, and/or another simulation technique that represents the physics of a response of sample 112 to a type of excitation. Because, in some embodiments, the assumptions underlying the Bloch equations are invalid (such as the parallel and antiparallel components of the magnetization are coupled, e.g., when the state of the magnetization is not reset prior to an RF pulse sequence), additional error terms may be added to the Bloch equations. Therefore, the forward model may be able to compute a dynamic (e.g., time-varying) state of sample 112 in response to an arbitrary excitation in a range of possible excitations or excitation values.

In some analysis approaches, computer 116 may determine the model parameters by solving an inverse problem by iteratively modifying the model parameters associated with the voxels in the forward model until a difference between the predicted response and the measured dynamic magnetic response is less than a predefined value (such as 0.1, 1, 5 or 10%). (Note that 'an inverse problem' or an 'inverse model' starts with one or more result(s) or output(s) and then calculates the inputs or causes. This is the inverse of a 'forward problem,' which starts with the inputs and then calculates the one or more results or the outputs.) However, in this 'iterative approach,' source 110 may repeatedly apply different excitations, and measurement device 114 may repeatedly perform corresponding measurements. Consequently, the iterative approach may be time-consuming, expensive and complicated. Thus, the iterative approach may consume significant resources in system 100 until the appropriate model parameters are determined.

As described further below with reference to FIGS. 2-5, in order to address these problems, in the computation technique analysis engine 122 may use one or more predetermined or pretrained predictive models (such as a machine-learning model or a neural network, which may be specific to a particular sample or an individual, e.g., the predictive model may be a personalized predictive model, or a machine-learning model or neural network could be specific to a particular type of sample, e.g. humans, a type of disease or non-disease state, plants, or formalin fixed-paraffin embedded human tissue samples) to, at least in part, compute the model parameters on a voxel-by-voxel basis. For example, analysis engine 122 may use the measurements and information specifying the excitation as inputs to a predictive model, which provides, as an output, the model parameters associated with the voxels. Therefore, the predictive model may be trained on or may incorporate model-parameter information based at least in part on measurements or measurement results. In some embodiments, the predictive model may correct the measurements for extrinsic characteristics or a signature of a specific source 110 and/or measurement device 114 (such as RF noise or spatial magnetic-field inhomogeneity) and/or a particular excitation or measurement condition, so that the determined model parameters are intrinsic to sample 112 at a particular time when the measurements were performed.

Note that the model parameters may include: a spin-lattice relaxation time $T_1$ (which is the time constant associated with the loss of signal intensity as components of the nuclear-spin magnetization vector of a type of nuclei relax to be parallel with the direction of an external magnetic field), a spin-spin relaxation time $T_2$ (which is the time constant associated with broadening of the signal during relaxation of components of the nuclear-spin magnetization vector of a type of nuclei perpendicular to the direction of the external magnetic field), an adjusted spin-spin relaxation time $T_2^*$, proton or nuclei density (and, more generally, the densities of one or more type of nuclei), diffusion (such as components in a diffusion tensor), velocity/flow, temperature, off-resonance frequency, electrical conductivity, a dielectric constant, a permittivity, a magnetic susceptibility, and/or permeability.

If a subsequent simulation using these model parameters provided by the predictive model, the forward model and one or more excitations of one or more predicted responses of sample 112 (such as a simulated or predicted MR signal) agrees with the corresponding measurements (such as a difference between a predicted response and a measurement is less than a predefined value, e.g., 0.1, 1, 5 or 10%, or alternatively when an accuracy exceeds a predefined value), results engine (or module) 124 in computer 116 may provide the determined model parameters, such as by providing an output to a user, to another electronic device, to a display and/or to the memory. In some embodiments, results engine 124 may output a tensor field map for sample 112 with model parameters for 3 spatial×one temporal×up to N parameter dimensions, where each measurement may be a vector or scalar quantity.

Thus, when the accuracy exceeds the predefined value (such as 90, 95, 99 or 99.9%), the model parameters may be computed in a single pass without further iteration. Consequently, the model parameters having an accuracy exceeding the predefined value may be computed using fewer (or no) iterations with the predetermined predictive model (and, thus, more rapidly) than in the iterative approach without the predetermined predictive model.

Alternatively, when the accuracy is less than the predefined value, computer 116 may perform one or more iterations in which one or more different, modified or revised excitations (such as a different RF pulse sequence) are applied to sample 112 by source 114, and one or more corresponding additional measurements are performed by measurement device 114. These one or more additional measurements may be used by computer 116 to determine the model parameters with an accuracy less than the predefined value.

For example, analysis engine 122 may use a second predetermined predictive model (such as a second machine-learning model or a second neural network) to determine a revised excitation. Notably, using information specifying the excitation and the accuracy as inputs, the second predictive model may output the revised excitation. Then, system 100 may repeat the applying, measuring, computing and determining operations with the revised excitation instead of the excitation. Therefore, the second predictive model may be trained on or may incorporate excitation information based at least in part on remaining differences between the predicted response and the measurement in order to reduce or eliminate the remaining differences in one or more subsequent iterations of the operations performed by system 100. In some embodiments, the second predictive model may revise a sampling frequency, a characterization technique, etc. to determine additional information that allows the determination of the model parameters using the first predictive model to converge (i.e., to have an accuracy less than the predefined value). Stated differently, the next perturbation or disturbance (such as the RF excitation and/or the pulse sequence) may be chosen to minimize the error or the difference across the hyper-dimensional space.

In some embodiments, when the accuracy is less than the predefined value, training engine (or module) 126 in computer 116 may: add the excitation and the measured response to a training dataset; and determine, using the training dataset, a revised instance of the predictive model for subsequent use in determining the model parameters. Thus, the measurements performed by system 100 may be selectively used in an adaptive learning technique to improve the predictive model and, therefore, the determined model parameters for a range of excitations (such as different values of the wavelength and the intensity or the flux).

Using the model parameters and the forward model, analysis engine 122 may simulate or predict a response of sample 112 to an arbitrary excitation, such as an arbitrary external magnetic field strength or direction (such as 0 T, 6.5 mT, 1.5 T, 3 T, 4.7 T, 9.4 T, and/or 15 T, or a time-varying direction, e.g., a slowly rotating external magnetic field), an arbitrary optional gradient, an arbitrary pulse sequence, an arbitrary magnetic state or condition (e.g., in which the magnetization or polarization of sample 112 is not returned to, been reset to or re-magnetized to an initial state prior to a measurement), etc. Therefore, the model parameters and the forward model may be used to facilitate fast and more accurate measurements, such as: soft-tissue measurements, morphological studies, chemical-shift measurements, magnetization-transfer measurements, MRS, measurements of one or more types of nuclei, Overhauser measurements, and/or functional imaging. For example, in embodiments where computer 116 determines the model parameters concurrently with measurements performed on sample 112 by source 110 and measurement device 114 (i.e., in real time), system 100 may rapidly characterize one or more physical parameters of sample 112 (at the voxel level or on average) on time scales smaller than $T_1$ or $T_2$ in an arbitrary type of tissue. This capability may allow system 100 to perform initial measurements to determine the model parameters, and then to use the determined model parameters to simulate or predict MR signals to complete or fill in ongoing measurements being performed by system 100, so that the results can be obtained more rapidly (and, thus, with a shorter MR scan time). Note that, in some embodiments, system 100 may determine the results (such as detecting an anomaly or a change in sample 112) based at least in part on quantitative comparisons of previous results obtained on sample 112, such as stored model parameters for the voxels in sample 112 that were determined during a previous MR scan(s) of sample 112. Such comparisons may be facilitated by 3D registration information that allows the voxel positions in sample 112 at different times to be aligned. In some embodiments, the results are based at least in part on a physician's instructions, medical lab test results (e.g., a blood test, urine-sample testing, biopsies, genetic or genomic testing, etc.), an individual's medical history, the individual's family history, quantitative tensor field maps with voxel-dependent multi-dimensional data for sample 112 or other samples, impedance of sample 112, a hydration level of sample 112 and/or other inputs.

Furthermore, as described further below with reference to FIG. 6, in some embodiments analysis engine 122 may classify or segment one or more anatomical structures in sample 112 using the determined model parameters and a third predetermined predictive model (such as a third machine-learning model and/or a third neural network). For example, using the simulated or predicted response of sample 112 at the voxel level or the determined model parameters at the voxel level, the third predictive model may output the locations of different anatomical structures and/or may output classifications of different voxels (such as a type of organ, whether they are associated with a particular disease state, e.g., a type of cancer, a stage of cancer, etc.). Therefore, in some embodiments, the third predictive model may be trained on or may incorporate classification of segmentation information based at least in part on variation in the model parameters across boundaries between different voxels (such as discontinuous changes). This capability may allow analysis engine 122 to identify different anatomical structures (which may assist in the determination of the model parameters) and/or to diagnose or to make a diagnosis recommendation about a medical condition or a disease state. In some embodiments, the classification or segmentation is performed prior to, concurrently or following the determination of the model parameters.

In some embodiments, training engine 126 may have, at least in part, trained the predictive model, the second predictive model and/or the third predictive model using a simulated dataset. For example, training engine 126 may have generated the simulated dataset using the forward model, a range of model parameters and a range of excitations. In this way, simulated data may be used to accelerate training of one or more predictive models.

Notably, because the computation technique may capture all relevant information during the measurements (such as an MR scan), the forward model can be used in an off-line mode to curate an extensive, labeled dataset that includes a large number of possible scenarios (such as different measurement conditions). This database can then be used to train predictive models. This capability may address the difficulty in obtaining MR data that is accurately labeled, reproducible, and artifact-free.

In conjunction with the generated dataset, one or more predictive models can be used to select regularization that accelerates the initial data acquisition and/or denoising. Moreover, the one or more predictive models can also be used to accelerate simulations or reconstruction using the forward model. For example, a predictive model can provide initial model parameters for use in the forward model, which may reduce the number of iterations required for the measurements and the simulations to converge on a solution that has an accuracy exceeding the predefined value. Thus, if the initial model parameters result in predicted response that are very different from the measurements, this can be feedback into the subsequent measurements and simulations to improve the model parameters and, thus, the predicted response.

Furthermore, if there is a portion of the model-parameter space that is not covered by the predictive model(s), new data points can be accurately generated and labeled to train the predictive model(s). Additionally, the predictive model(s) may be trained based on different metrics corresponding to different applications. For example, the predictive model(s) may be training to optimize the excitations used in difference scenarios (such as fast scanning for asymptomatic population, high accuracy for specific tissue properties, robustness to variations in the signal-to-noise ratio, different hardware imperfections, etc.).

In some embodiments, analysis engine 122 may run a neural network that determines first model parameters based at least in part on measured or simulated data and may perform brute-force nonlinear numerical calculations to solve an inverse problem using the measured or the simulated data to determine second model parameters. The difference between the first and the second model parameters from these two 'inverse solvers' may be used as the error in the neural-network-based approach. This approach may allow the neural network to learn because the numerical approach may be able to give real-time feedback to the neural network and to update the weights in the neural network. This hybrid approach would still not require or need a priori training, but would be able to leverage the pattern-matching benefits of large neural networks with the determinism and accuracy of simulation/numerical techniques to solve the inverse problem. The hybrid approach may assist the neural network when it has an input unlike any of the examples used to train it. Similarly, the hybrid approach may be used to go directly from time-domain measurement to the model-parameterized output (i.e. the inverse problem outputs). In some embodiments, the hybrid approach is implemented using a generative adversarial network (GAN).

Note that, in some embodiments, the forward model may be independent of a particular MR apparatus or scanner. Instead, the forward model may be, e.g., specific to an individual. The predicted response computed using the forward model may be adjusted to include characteristics or a signature of a particular MR apparatus or scanner, such as magnetic-field inhomogeneity or spatial variation in the magnetic field, RF noise, a particular RF pickup coil or another magnetic sensor, variation in the characteristics or the signature with the external magnetic-field strength or the measurement conditions (such as the voxel size), geographic location, time (due to, e.g., magnetic storms), etc. Thus, the predicted response may be machine-specific.

While the preceding discussion illustrated the computation technique using a single predictive model for sample 112, in other embodiments there may be multiple predictive models for sample 112. For example, different predictive models may be used to determine the model parameters for different portions of sample 112 (such as different organs or different types of tissue) and, thus, for different voxels. Therefore, in some embodiments different predictive models may be used to provide $T_1$ and $T_2$ values in different types of tissue, such as the values summarized in Table 1, which are for a specific magnetic field between 1-3 T.

TABLE 1

| Tissue | $T_1$ (s) | $T_2$ (ms) |
| --- | --- | --- |
| Cerebrospinal Fluid | 0.8-20 | 110-2000 |
| White Matter | 0.76-1.08 | 61-100 |
| Gray Matter | 1.09-2.15 | 61-109 |
| Meninges | 0.5-2.2 | 50-165 |
| Muscle | 0.95-1.82 | 20-67 |
| Adipose | 0.2-0.75 | 53-94 |

Moreover, while system 100 is illustrated as having particular components, in other embodiments system 100 may have fewer or more components, two or more components may be combined into a single component, and/or positions of one or more components may be changed.

Figure 2:
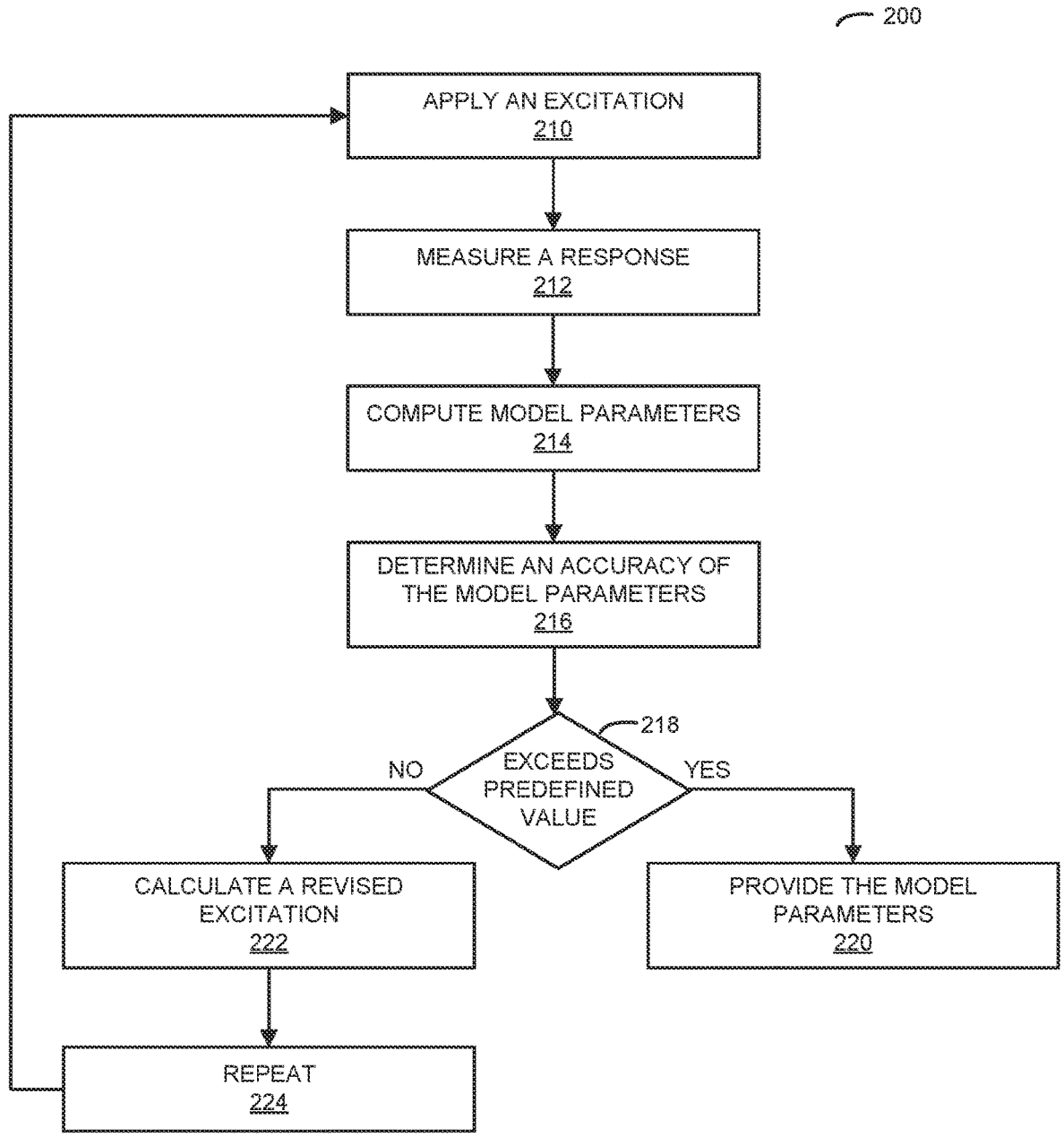
FIG. 2 is a flow diagram illustrating an example of a method for determining model parameters associated with a sample in accordance with an embodiment of the present disclosure.

We now discuss embodiments of a method. FIG. 2 presents a flow diagram illustrating an example of a method 200 for determining model parameters associated with a sample. This method may be performed by a system (such as system 100 in FIG. 1), or one or more components in a system (such as source 110, measurement device 114 and/or computer 116).

During operation, a source in the system may apply, to the sample, an excitation (operation 210), where the excitation has at least a wavelength and an intensity or a flux. For example, the excitation may include one of: electromagnetic radiation (such as a radio-frequency wave), a particle beam, a sound wave, a magnetic field, and/or an electric field. Therefore, the excitation may include at least one of: an electromagnetic beam in an x-ray band of wavelengths, a neutron beam, an electron beam, an electromagnetic beam in an optical band of wavelengths, an electromagnetic beam in an infrared band of wavelengths, a sound wave in an ultrasound band of wavelengths, a proton beam, an electric field associated with an impedance measurement device, a radio-frequency wave associated with a magnetic-resonance apparatus, and/or a magnetic field associated with a susceptibility measurement device (such as a Guoy balance).

Then, a measurement device in the system may measure a response (operation 212) associated with the sample to the excitation. For example, the measurement device may include at least one of: an x-ray detector, a neutron detector, an electron detector, an optical detector, an infrared detector, an ultrasound detector, a proton detector, the magnetic-resonance apparatus, the impedance measurement device and/or the susceptibility measurement device. Note that the measured response may include a time-domain response of the sample and may be other than or different from an image.

Moreover, the system may compute, using the measured response and information specifying the excitation as inputs to a predetermined predictive model, model parameters (operation 214) on a voxel-by-voxel basis in a forward model with multiple voxels that represent the sample. The forward model may simulate response physics occurring within the sample to a given excitation with a given wavelength and a given intensity or a given flux, that are selected from a range of measurement conditions that includes the excitation, the wavelength and the intensity or the flux, and at least a different wavelength and a at least a different intensity or a different flux. Furthermore, the forward model may be a function of the excitation, the model parameters of the multiple voxels, and differential or phenomenological equations that approximate the response physics.

Note that the predetermined predictive model may include a machine-learning model and/or a neural network. In some embodiments, the predetermined predictive model includes a personalized predictive model that corresponds to an individual.

Next, the system may determine an accuracy of the model parameters (operation 216) by comparing at least the measured response and a calculated predicted value of the response using the forward model, the model parameters and the excitation.

Additionally, when the accuracy exceeds a predefined value (operation 218), the system may provide the model parameters (operation 220) as, e.g., an output to a user, to another electronic device, to a display and/or to the memory.

Thus, when the accuracy exceeds the predefined value (operation 218), the model parameters may be computed in a single pass without further iteration. Consequently, the model parameters having an accuracy exceeding the predefined value may be computed using fewer iterations with the predetermined predictive model than in the iterative approach without the predetermined predictive model.

Alternatively, when the accuracy is less than the predefined value (operation 218), the system may: calculate, using information specifying the excitation and the accuracy as inputs to a second predetermined predictive model, a revised excitation (operation 222) that has at least a revised wavelength, a revised intensity or a revised flux; and repeat (operation 224) the applying, measuring, computing and determining operations with the revised excitation instead of the excitation. Note that the second predetermined predictive model may include a machine-learning model and/or a neural network.

In some embodiments, the system optionally performs one or more optional additional or alternative operations. For example, when the accuracy is less than the predefined value (operation 218), the system may: add the excitation and the measured response to a training dataset; and determine, using the training dataset, a revised instance of the predictive model.

Additionally, the system may classify or segment one or more anatomical structures in the sample using the model parameters and a third predictive model. For example, the third predetermined predictive model may include a machine-learning model and/or a neural network.

Moreover, the system may train the predictive model using a simulated dataset computed using the forward model, a range of model parameters and a range of excitations.

In some embodiments of method 200, there may be additional or fewer operations. Furthermore, the order of the operations may be changed, and/or two or more operations may be combined into a single operation.

Figure 3:
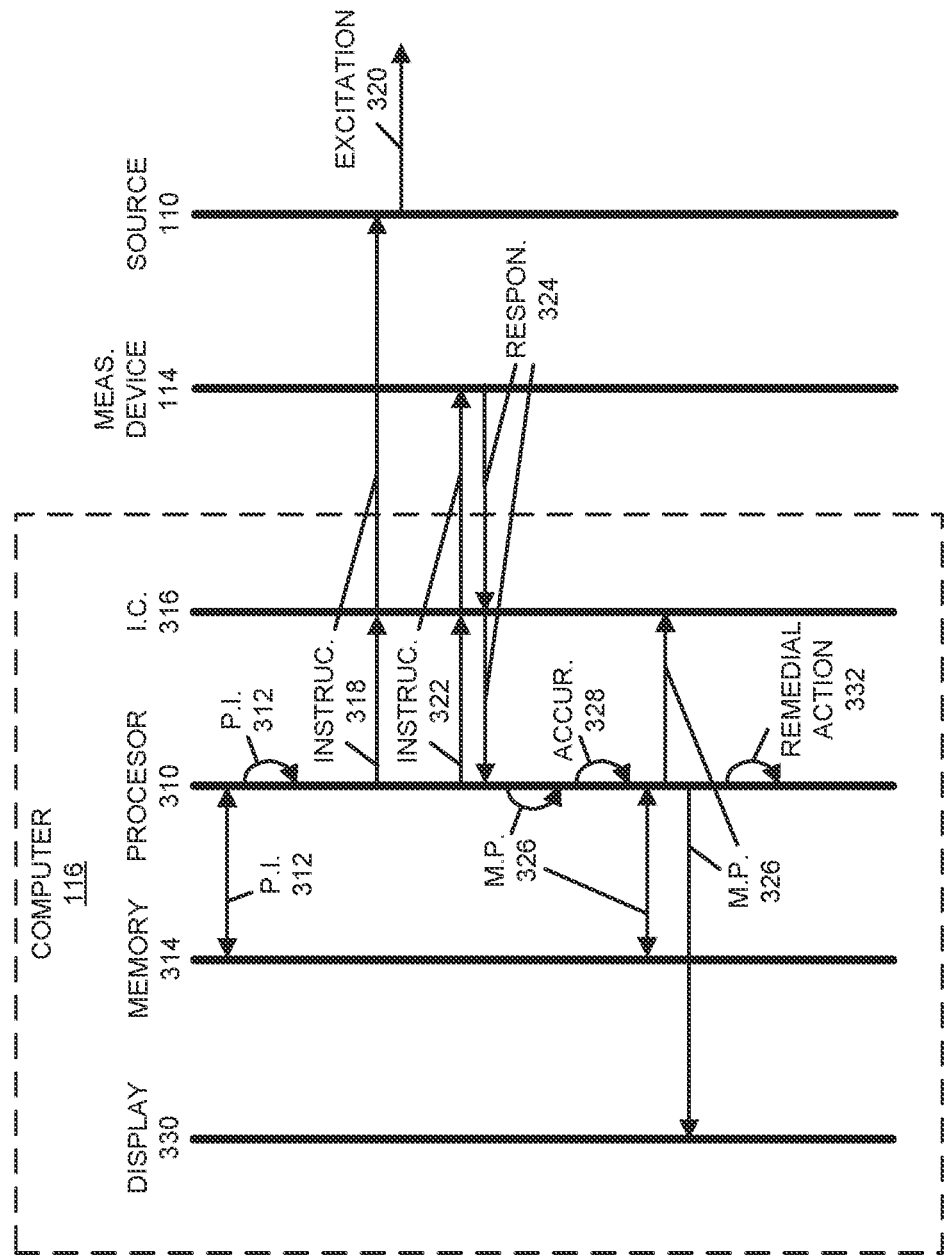
FIG. 3 is a drawing illustrating an example of communication among components in the system in FIG. 1 in accordance with an embodiment of the present disclosure.

FIG. 3 presents a drawing illustrating an example of communication among components in system 100 (FIG. 1). Notably, processor 310 in computer 116 may execute program instructions (P.I.) 312 stored in memory 314. When processor 310 executes program instructions 312, processor 310 may perform at least some of the operations in the computation technique.

During the computation technique, processor 310 may provide instruction 318 to interface circuit (I.C.) 316. In response, interface circuit 316 may provide instruction 318 to source 110, e.g., in one or more packets or frames. Moreover, after receiving instructions 318, source 110 may apply, to the sample, an excitation 320.

Then, processor 310 may provide instruction 322 to interface circuit 316. In response, interface circuit 316 may provide instruction 322 to measurement device 114, e.g., in one or more packets or frames. Furthermore, after receiving instructions 322, measurement device 114 may measure a response 324 associated with the sample to excitation 320. Next, measurement device 114 may provide measured response 324 to computer 116, e.g., in one or more packets or frames.

After receiving measured response 324, interface circuit 316 may provide measured response 324 to processor 310. Then, using measured response 324 and information specifying excitation 320 as inputs to a predetermined predictive model, processor 310 may compute model parameters (M.P.) 326 on a voxel-by-voxel basis in a forward model with multiple voxels that represent the sample.

Additionally, processor 310 may determine an accuracy 328 of the model parameters by comparing at least measured response 324 and a calculated predicted value of the response using the forward model, model parameters 326 and excitation 320. When accuracy 328 exceeds a predefined value, processor 310 may provide the model parameters 326 as, e.g., an output to a user, to another electronic device (via interface circuit 316), to a display 330 and/or memory 314.

Otherwise, when the accuracy is less than the predefined value, processor 310 may perform a remedial action 332. For example, processor 310 may: calculate, using information specifying excitation 320 and accuracy 328 as inputs to a second predetermined predictive model, a revised excitation; and repeat the applying, measuring, computing and determining operations with the revised excitation instead of excitation 320. Alternatively or additionally, processor 310 may: add excitation 320 and measured response 324 to a training dataset; and determine, using the training dataset, a revised instance of the predictive model.

We now describe embodiments of predictive models. For example, a predictive model may include a machine-learning model, such as a supervised-learning model or an unsupervised learning technique (such as clustering). In some embodiments, a machine-learning model may include: a support vector machine, a classification and regression tree, logistic regression, LASSO, linear regression, nonlinear regression, pattern recognition, a Bayesian technique, and/or another (linear or nonlinear) supervised-learning technique.

Figure 4:
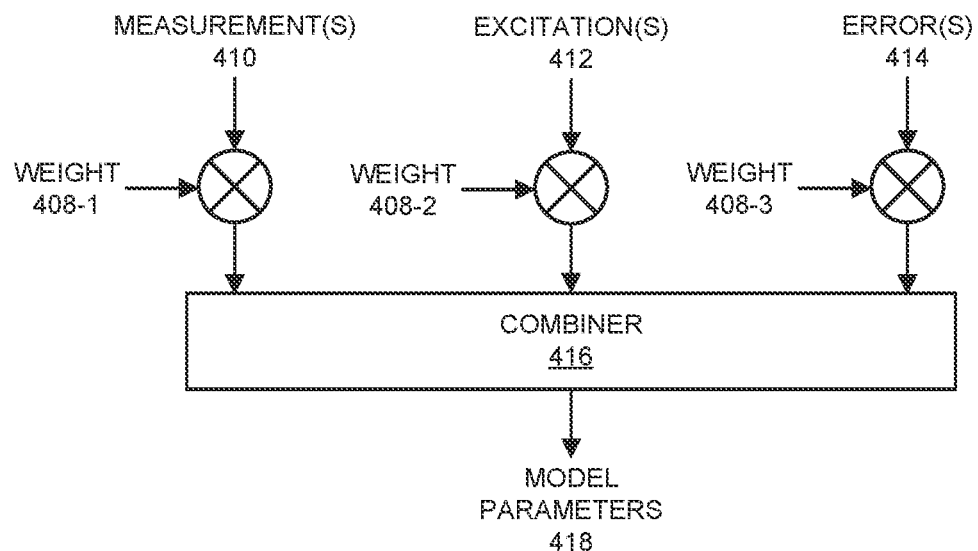
FIG. 4 is a drawing illustrating an example of a machine-learning model in accordance with an embodiment of the present disclosure.

FIG. 4 presents a drawing illustrating an example of a machine-learning model 400. In this machine-learning model, a weighted (using weights 408) linear or nonlinear combination 416 of measurements 410, one or more corresponding excitations 412 and one or more errors 414 between the one or more measurements 410 and one or more predicted responses determined using a forward model, a current instance of the model parameters of voxels in the forward model, and the one or more excitations 412 is used to compute a revised instance of model parameters 418. Thus, in some embodiments, predictive model 400 is used in conjunction with forward model to iteratively modify instances of the model parameters until an accuracy of the predicted response is less than a predefined value (i.e., a convergence criterion is achieved). However, in some embodiments, a machine-learning model may be used to determine the model parameters in one pass, i.e., in an open-loop manner.

Alternatively or additionally, a predictive model may include a neural network. Neural networks are generalized function approximators. For example, techniques such as deep learning typically use previous examples as inputs. In general, it is not possible for these machine-learning models to determine the actual function they are trying to approximate because there is no reference point for them to use to estimate the error in their predictions. In particular, it can be difficult for a neural network to make predictions based on an input that is very different from the examples it was trained on. In this regard, a neural network can be thought of as a compression engine.

However, by training a neural network using a wide variety of excitations, measured responses and corresponding model parameters, the neural network can provide the model parameters (or initial estimates of the model parameters) for a forward model that simulates the physics of a response of a sample to an excitation. Because neural networks are effective approximations/compressions, they may execute faster on the same inputs with less computational power required. Moreover, because the functions are known in the forward model, the responses can be computed and the accuracy of the predictions can be assessed (as opposed to using an approximation). Therefore, the computation technique can be used to determine when its predictions are unreliable. In particular, as discussed previously for FIG. 4, a neural network may be used in conjunction with forward model to iteratively modify instances of the model parameters until an accuracy of the predicted response is less than a predefined value (i.e., a convergence criterion is achieved). In some embodiments, however, a neural network may be used to determine the model parameters in one pass, i.e., in an open-loop manner.

Figure 5:
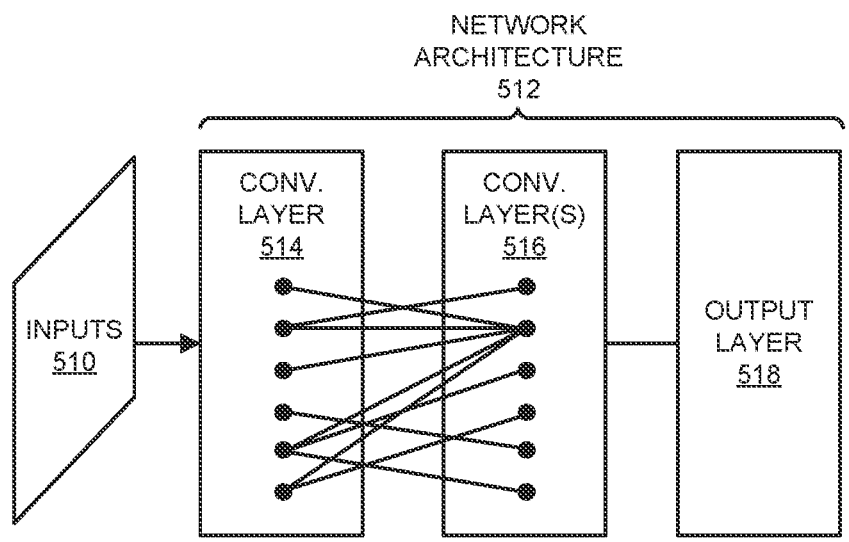
FIG. 5 is a drawing illustrating an example of a neural model in accordance with an embodiment of the present disclosure.

FIG. 5 presents a drawing illustrating an example of a neural network 500. This neural network may be implemented using a convolutional neural network or a recurrent neural network. For example, neural network 500 may include a network architecture 512 that includes: an initial convolutional layer 514 that provides filtering of inputs 510 (such as one or more measurements and a difference or an error between the one or more measurements and one or more predicted responses determined using a forward model, a current instance of model parameters and an excitation); an additional convolutional layer(s) 516 that apply weights; and an output layer 518 (such as a rectified linear layer) that performs selection (e.g., selecting a revised instance of the model parameters). Note that the details with the different layers in neural network 500, as well as their interconnections, may define network architecture 512 (such as a directed acyclic graph). These details may be specified by the instructions for neural network 500. In some embodiments, neural network 500 is reformulated as a series of matrix multiplication operations. Neural network 500 may be able to handle the real-world variance in 1 million inputs or more. Note that neural network 500 may be trained using a deep-learning technique or a GAN. In some embodiments of machine-learning model 400 (FIG. 4) and/or neural network 500, a current instance of the model parameters is used as an input.

In some embodiments, a large convolutional neural network may include 60 M parameters and 650,000 neurons. The convolutional neural network may include eight learned layers with weights, including five convolutional layers and three fully connected layers with a final 1000-way softmax or normalized exponential function that produces a distribution over the 1000 class labels for different possible model parameters. Some of the convolution layers may be followed by max-pooling layers. In order to make training faster, the convolutional neural network may use non-saturating neurons (such as a local response normalization) and an efficient dual parallelized graphics processing unit (GPU) implementation of the convolution operation. In addition, in order to reduce overfitting in the fully-connected layers, a regularization technique (which is sometimes referred to as 'dropout') may be used. In dropout, the predictions of different models are efficiently combined to reduce test errors. In particular, the output of each hidden neuron is set to zero with a probability of 0.5. The neurons that are 'dropped out' in this way do not contribute to the forward pass and do not participate in backpropagation. Note that the convolutional neural network may maximize the multinomial logistic regression objective, which may be equivalent to maximizing the average across training cases of the log-probability of the correct label under the prediction distribution.

In some embodiments, the kernels of the second, fourth, and fifth convolutional layers are coupled to those kernel maps in the previous layer that reside on the same GPU. The kernels of the third convolutional layer may be coupled to all kernel maps in the second layer. Moreover, the neurons in the fully connected layers may be coupled to all neurons in the previous layer. Furthermore, response-normalization layers may follow the first and second convolutional layers, and max-pooling layers may follow both response-normalization layers as well as the fifth convolutional layer. A nonlinear model of neurons, such as Rectified Linear Units, may be applied to the output of every convolutional and fully-connected layer.

In some embodiments, the first convolutional layer filters a 224×224×3 input image with 96 kernels of size 11×11×3 with a stride of four pixels (this is the distance between the receptive field centers of neighboring neurons in a kernel map). Note that the second convolutional layer may take as input the (response-normalized and pooled) output of the first convolutional layer and may filter it with 256 kernels of size 5×5×48. Furthermore, the third, fourth, and fifth convolutional layers may be coupled to one another without any intervening pooling or normalization layers. The third convolutional layer may have 384 kernels of size 3×3×256 coupled to the (normalized, pooled) outputs of the second convolutional layer. Additionally, the fourth convolutional layer may have 384 kernels of size 3×3×192, and the fifth convolutional layer may have 256 kernels of size 3×3×192. The fully-connected layers may have 4096 neurons each. Note that the numerical values in the preceding and the remaining discussion below are for purposes of illustration only, and different values may be used in other embodiments.

In some embodiments, the convolutional neural network is implemented using at least two GPUs. One GPU may run some of the layer parts while the other runs the remaining layer parts, and the GPUs may communicate at certain layers. The input of the convolutional neural network may be 150,528-dimensional, and the number of neurons in the remaining layers in the convolutional neural network may be given by 253, 440-186, 624-64, 896-64, 896-43, and 264-4096-4096-1000.

We now describe embodiments of a forward model. This forward model may be a 3D model of voxels in a portion of a sample (such as an individual), and may include model parameters in the Bloch equations for each of the voxels. In particular, with a quasi-static magnetic field $B_0$ along the z axis, the Bloch equations are $$\frac{dM_x(t)}{dt} = \gamma \cdot \left(\vec{M}(t) \otimes \vec{B}(t)\right)_x - \frac{M_x(t)}{T_2},$$

$$\frac{dM_y(t)}{dt} = \gamma \cdot \left(\vec{M}(t) \otimes \vec{B}(t)\right)_y - \frac{M_y(t)}{T_2}, \text{ and}$$

-continued $$\frac{dM_z(t)}{dt} = \gamma \cdot \left(\vec{M}(t) \otimes \vec{B}(t)\right)_z - \frac{M_z(t) - M_0}{T_1},$$

where $\gamma$ is the gyromagnetic ratio, $\otimes$ denotes a vector cross product and $\vec{B}(t) = (B_x(t), B_y(t), B_0 + \Delta B_z(t))$ is the magnetic field experienced by a type of nuclei in the sample. The model parameters in the Bloch equations may include $T_1$, $T_2$, a density of a type of nuclei, diffusion, velocity/flow, temperature, magnetic susceptibility, etc. Note that there may be different model parameters for different types of nuclei for each of the voxels. Moreover, note that the Bloch equations are a semi-classical, macroscopic approximation to the dynamic response of the magnetic moments of the type of nuclei in the sample to a time-varying magnetic field. For example, there may be 67 M cells in a 1 mm³ voxel.

In principle, the solution space for the model parameters in the Bloch equations for the sample may be underdetermined, i.e., there may be significantly more model parameters to be determined than there are observations with which to specify or constrain the model parameters. Therefore, when training a predictive model or determining the model parameters using the predictive model (such as using computations in a machine-learning model or in a layer in a neural network), the computation technique may leverage additional information to constrain or reduce the dimensionality of the problem. For example, an aspect of the anatomy of the sample may be determined using other imaging techniques, such as computed tomography, x-ray, ultrasound, etc. Moreover, regions that do not look like (i.e., that has very different measurements, e.g., different measured MR signals) than a targeted type of tissue (such as heart tissue) may be excluded from the forward model (such as by setting the model parameters to zero in these regions). In this way, e.g., regions that consist of air may be excluded. Other constraints in the forward model may include: thermodynamic constraints on heat flow (from hot to cold) for perfusion or MRT to quantify metabolism. In addition, the predictive model may be trained using measurements at different magnetic-field strengths $B_0$ (which may provide similar information to pseudorandom pulse sequences) using different pulse sequences and/or different MR techniques, which may reduce the ratio of model parameters to observations, thereby simplifying the training of the predictive model.

Alternatively or additionally, tissue that deviates significantly from a predicted or simulated response (such as predicted MR signals) based on previous MR measurements or scans (e.g., anomalies or changes) may become the focus of the forward model, such as by using a contour map (e.g., a cubic spline) to bound the regions (or specify a boundary of the regions) where there are significant differences. In some embodiments, when training the predictive model or determining the model parameters using the predictive model (such as using computations in a machine-learning model or in a layer in a neural network), the difference or error between measurements and simulated or predicted responses may be represented using one or more level-set functions, and the boundaries of regions with errors exceeding a threshold value may be determined based on the intersection of a plane corresponding to the threshold value and the one or more level-set functions.

In some embodiments, a layer in a neural network may compute first and second derivatives along a surface(s) of model-parameter solutions in the sample. (In order to facilitate calculation of a derivative, the model parameters may be represented using one or more level-set functions.) A set of voxels along the line where the first derivative is zero may be identified. This set of voxels may be fit using a cubic spline with a minimum error between the voxel positions and the cubic spline. This fitting operation may be repeated at all the boundaries in the model-parameter-solution space. Moreover, the largest continuous surface within the boundary defined by the cubic splines may be determined and the model-parameter-solution calculation may be repeated to determine a new continuous surface that is within the previous continuous surface. This generalized framework may minimize the error across intra-voxel volumes, thereby improving the agreement between the measurements and the simulated or predicted responses based on the forward model.

For example, a neural network may solve the inverse problem using a Jacobian matrix of the model parameters for the voxels in the forward model and Newton's method to modify the model parameters for the voxels in successive layers based on how perturbations in the model parameters affect the difference or error between the measurements and the predicted responses.

In some embodiments, if a portion of the sample included one voxel, there may be 4-10 model parameters (which specify a forward model) that need to be determined for a particular type of tissue. If the voxel includes M types of tissue, there may be 4M-10M model parameters that need to be determined for the particular type of tissue. As the number of voxels increases, this can appear to be a daunting problem.

However, because different types of nuclei have different Larmor frequencies, the spatial distribution of the types of nuclei and their local concentrations may be determined from the measurements. Then, a predefined anatomical template for the human body (or a portion of the human body), with associated initial model parameters for the forward model, may be scaled to match the spatial distribution of the types of nuclei and their local concentrations. For example, predetermined or predefined ranges for the model parameters in different types of tissue may be used to determine for the initial model parameters. In some embodiments, the initial model parameters are based on model parameters associated with previous measurements or MR scans.

Next, a look-up table with simulated or predicted responses (generated using one or more forward models) as a function of associated model parameters and excitations may be used modify the initial model parameters or to compute model parameters for voxels in the sample. For example, simulated or predicted responses that are similar to measurements may be identified, and the differences or errors between these simulated or predicted responses and the measurements may be used to guide interpolation between the model parameters in the look-up table.

In some embodiments, for a type of tissue (such as a particular organ), the model parameters determined using different layers in a neural network may be iteratively refined as the size of the voxels is progressively decreased (and, thus, the number of voxels is increased) in the different layers. This analysis may be driven by the error between the measurements and simulated or predicted responses using the forward model. Progressing through successive layers in a neural network, the focus may be on the residual regions with errors that are larger than a convergence or an accuracy criterion. For example, the model parameters for the forward model in a layer in a neural network may be based on measurements at one magnetic-field strength and then the error may be determined based on the predicted response of the forward model at another magnetic-field strength. Furthermore, note that initially the predictive model or the forward model may assume that there is no contribution or interaction between different voxels. However, as the error and the voxel size are reduced, such contributions and/or interactions may be included in subsequent layers in a neural network. In some embodiments, when there are multiple candidate model-parameter solutions (having similar errors) to the inverse problem for a layer in a neural network, at least some of these candidates may be kept for use in a subsequent layer (i.e., a unique model-parameter solution may not be identified at this point). Alternatively, if there is no unique parameter solution within a desired error range (such as less than 50, 25, 10, 5 or 1%), the best (least-error) model-parameter solution may be kept. In addition, when there is no model-parameter solution within the desired error range, the second predictive model may be used to modify the excitation and additional measurement(s) may be performed.

Thus, the inverse problem of determining the model parameters based on measurements may be 'solved' using a predictive model that provides model parameters that minimize the error or difference between the measurements and simulated or predicted responses that are generated based on the forward model, the model parameters and an excitation. In some embodiments, the inverse problem is solved using one or more analysis techniques, including: a least-squares technique, a convex quadratic minimization technique, a steepest descents technique, a quasi-Newton technique, a simplex technique, a Levenberg-Marquardt technique, simulated annealing, a genetic technique, a graph-based technique, another optimization technique and/or Kalman filtering (or linear quadratic estimation).

Note that the training of a predictive model may use dynamic programming. In particular, the training problem may be divided up and performed by multiple computers in parallel, e.g., in a cloud-based computing system. For example, a particular thread may attempt to solve the inverse problem for particular measurement conditions. Multiple potential model-parameter solutions generated by the computers (or processors) may be combined (e.g., using linear superposition) to determine an error metric that is minimized using the one or more analysis techniques.

Moreover, as described previously, the inverse problem may be solved iteratively by a predictive model (such as machine-learning model or a neural network) by first attempting to find suitable model parameters (e.g., model parameters that minimize the error between measurements and simulated or predicted responses) for the forward model using a coarse voxel size and then progressively finding suitable parameters with smaller voxel sizes in subsequent layers or stages of the calculation. Note that the final voxel size used in this iterative procedure (or a suitable range of voxel sizes, because the voxel size may not be fixed in some embodiments) may be determined based on the gyromagnetic ratio of a type of nuclei being scanned. Furthermore, the voxel size or locations may also be chosen so that a voxel is evenly portioned into a set of subvoxels, or so that there is certain amount of overlap with preview voxel sizes to effectively 'oversample' the overlapping region and potentially further localize where an MR signal originates. This last technique may be akin to shifting the entire gradient system in one or more dimensions by a distance dx that is less than a characteristic length of the voxels (such as a length, a width or a height of the voxels). In some embodiments, the voxel size in the predictive model or the forward model is smaller than that used in the measurements (i.e., the predictive model or the forward model may use a super-resolution technique). For example, there may be 512×512 voxels or 1024×1024 voxels at a magnetic-field strength of 3 T. Note that the voxel size may be less than 0.25³ mm³.

We now describe embodiments of a technique for segmenting different types of tissue, which may be used by the third predictive model (such as a neural network). Define a dictionary D of measured time-sampled MR trajectories (or vectors) in a multi-dimensional parameter space for different types of tissue dj (for j=1 to n) such that a measured MR signal $y_{obv}$ for a voxel can be expressed as $$y_{obv} = \sum_{j=1}^{n} \alpha_j \cdot d_j + \varepsilon,$$

where $\alpha_j$ are normalized weights $$\left(\text{i.e., } \sum_{j=1}^{n} \alpha_j = 1\right)$$

and $\varepsilon$ is an error (i.e., $\varepsilon=(y_j, \alpha_j)$, for j=1 to n. This may define an intra-voxel linear equation problem. A generalized inter-voxel problem may model a set of voxels (such as a cube with 27 voxels) as a graph G. Note that each voxel in the set may have 26 edges to eight adjacent voxels. A parameter solution to the inverse problem may be defined as one that minimizes the error.

Consider the case of two adjacent voxels u and v. The intra-voxel linear equations $U_y$ and $V_y$ need to be solved at both u and v. There are several possible outcomes. First, $U_y$ and $V_y$ may have unique model-parameter solutions (where a 'unique model-parameter solution' may be a best fit to an existing forward model, i.e., with an error or difference vector that is less than a convergence or an accuracy criterion) and the analysis may be finished. Alternatively, $U_y$ may have a unique model-parameter solution but not $V_y$. It may be possible that the model-parameter solution for $U_y$ imposes a constraint on $V_y$ such that $V_y$ has a single model-parameter solution, in which case the analysis may be finished. However, neither $U_y$ nor $V_y$ may have unique model-parameter solutions, in which case combining the systems of equations (i.e., effectively increasing the voxel size) may yield a unique model-parameter solution. Moreover, neither $U_y$ nor $V_y$ may have any model-parameter solutions, in which case the intra-voxel problem cannot be solved without further constraints.

In the last case, it may be possible to look at an adjacent voxel w, i.e., series voxels u, v and w, with the corresponding intra-voxel linear equations $U_y$, $V_y$ and $W_y$ need to be solved at u, v and w. Note that the intra-voxel linear equations $V_y$ and $W_y$ reduce to the previous case. When the intra-voxel linear equations do not reduce to the previous case, this paring operation can be applied recursively until it does and then the intra-voxel linear equations can be solved as described previously.

In general, this analysis technique may be isomorphic to the problem of fitting a 3D surface (or volume) to minimize the error. One challenge in this regard is that it assumes that all adjacent volumes have an equal effect on the model-parameter solution $\alpha_j$ that minimizes the error.

The minimization of the error may initially assume that there is no inter-voxel contribution (i.e., that the voxels are independent). Subsequently, inter-voxel contributions may be included. In particular, considering adjacent voxel volumes, there are two distinct classes. Volumes that share a surface and volumes that only share a 1D edge. The minimization function can be improved by weighting the error contribution at voxel u at the center of the relative co-ordinate system. If the effect on the error is proportional to $r^{-2}$ (where r is the distance between center points of voxels) and assuming 1 mm isotropic voxels in the weightings, the minimization or fitting problem with inter-voxel contributions can be expressed as min(error($y$(0, 0, 0), $$\alpha(0, 0, 0) + \frac{1}{(1)^2}\sum_{k=1}^{m}\text{error}(y_k, \alpha_k) + \frac{1}{(\sqrt{2})^2}\sum_{l=1}^{p}\text{error}(y_l, \alpha_l),$$

where the summation over k is for adjacent voxels sharing a common surface (i.e., (−1,0,0), (1,0,0), (0,−1,0), (0,1,0), (0,0,−1) and (0,0,1)) and the summation over l is for a remainder of adjacent voxels sharing a common edge. The assumption in the analysis is that the most difficult place to fit or determine model-parameter solutions is at discontinuities or interfaces between different tissues. Consequently, during the computation technique, analysis engine 122 (FIG. 1) may solve these locations first and then may solve the remaining locations.

Alternatively, because the magnetic contribution from neighboring voxels is proportional to $r^2$, given a sphere of radius R from the center of a primary or central voxel in the minimization problem, surrounding voxels may be weighted based on the how much the sphere expands into the volume of the adjacent voxels (and, thus, based on how strong their inter-voxel contribution is estimated to be). For example, there may be three different weights that need to be assigned, including: a weight for voxels that share a 2D surface, a weight for voxels that share a 1D line, and a weight for voxels that share a 0D point. Because there may not be a uniform tissue distribution within each voxel, the weights may be dynamically adjusted to model different kinds of distributions inside each voxel in order find the distributions that minimize the error. This may provide the ability to identify multiple MR signatures within a single voxel for different types of tissue. Note that, as computational power increases, the accuracy of the third predictive model may increase and the analysis technique used to solve the minimization problem (and, thus, the inverse problem) may be modified.

Thus, in embodiments where the forward model of a voxel depends on the forward models of surrounding or neighboring voxels, the forward model of a voxel may be computed using $2^{nd}$ or $N^{th}$-order effects. For example, if there are N $1^{st}$-order forward models (where N is an integer), there may be as many as N!/(N−27)! $2^{nd}$-order forward models (if all the voxels interact with each other). In some embodiments, locality is used to simplify the inverse problem. In this way, a forward model may be generated by incorporating how the forward models in adjacent voxels effect the forward model in a primary (central) or $1^{st}$-order voxel.

In some embodiments, a dithering technique is used to overcome the arbitrary locations of the voxels relative to the distribution of types of tissue in the body. In particular, there may be two or more types of tissue in a voxel because of the arbitrary voxel placement or the current voxel size. This may significantly change the forward model parameters for this voxel. This may suggest that there is more than one forward model needed for the voxel. In order to confirm this, the voxels may be displaced by a distance dx (which is a fraction of the voxel length, width or height) and the forward model parameters may be determined again (e.g., using the predictive model). In the processes, the tissue distribution may be determined. Consequently, this approach may effectively increase the spatial resolution in the analysis without changing the voxel size.

Figure 6:
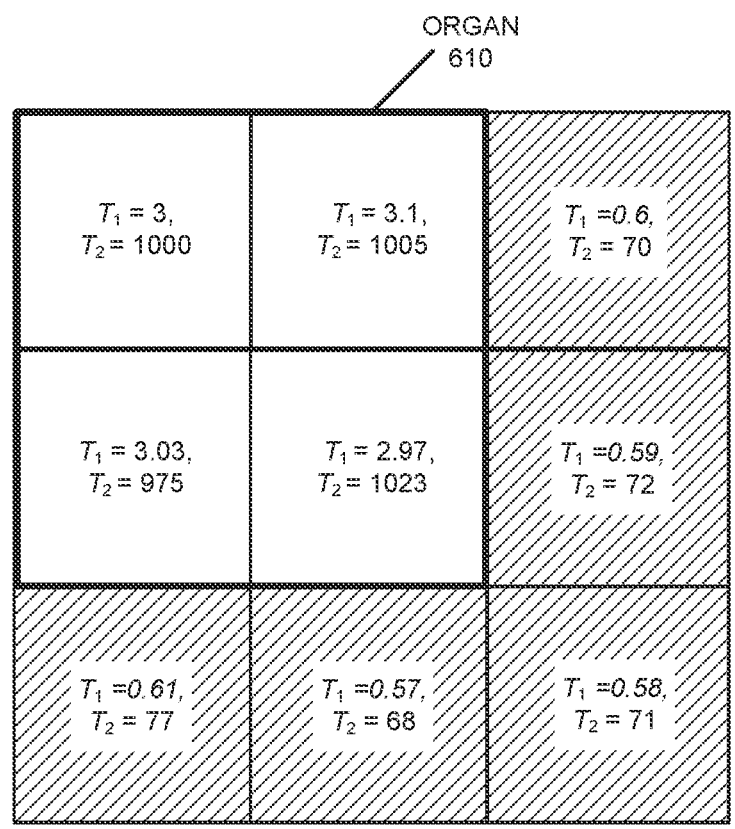
FIG. 6 is a drawing illustrating an example of classification or segmentation of one or more anatomical structures in the sample in accordance with an embodiment of the present disclosure.

FIG. 6 presents a drawing illustrating an example of classification or segmentation of one or more anatomical structures 600. Notably, FIG. 6 illustrates identifying or segmenting an organ 610 based at least in part on discontinuous changes in $T_1$ and $T_2$ at voxel boundaries.

While the preceding discussion illustrated the computation technique using MR techniques, this approach may be generalized to a measurement system that is able to physically model and measure a sample in real-time using a wide variety of characterization techniques. In general, the computation technique can use a combination of mechanical and/or electromagnetic waves to 'perturb' or 'excite' the volume being scanned in order to evaluate the correctness of a prediction in terms of how the volume responds to the perturbation. This also includes the ability for the system to simulate itself and any part of the environment in which the system is located that could affect the correctness or accuracy of the forward model the system is trying to generate to describe the volume being scanned or measured.

Note that the different characterization techniques may provide tensor-field mapping and the ability to detect anomalies in tensor fields. These maps can be images or quantitative tensor field maps, and each of the characterization techniques may provide a visualization of a different type of tensor field map captured with different type of measurements. By looking at or considering two or more of these maps, of the system may have access to orthogonal information.

As discussed previously, tensor field mapping may use quantitative simulations of measured physical phenomena, such as measurements using an MR technique and/or a mechanical excitation technique, to solve for material properties and other useful physical phenomena. More specifically, tensor field mapping may iteratively solve a set of linear and/or non-linear physics equations.

In some embodiments, tensor field mapping can converge or solved using an optimization technique, which may allow a richer set of parameters to be considered in a cost function together with various regularization terms or constraints (e.g., a Tikhonov or a total variation regularizer). Notably, the cost function in an optimization problem may be based on spin-dynamics physics (e.g., the Bloch equations or its variants, such as the Bloch-Torrey equations) or a combination of spin- and electro-dynamics (e.g., coupling the Bloch equations with Maxwell's equations). In the latter case, Maxwell's equations may be useful for modeling and regularizing the optimization problem. For example, using Maxwell's equations in the optimization problem may constrain the RF pulses. Additionally, the use of Maxwell's equations in the optimization problem may allow the electrical parameters (permittivity and conductivity) of a sample to be determined. This capability may be useful at high magnetic fields, such as magnetic field magnitudes greater than 1 T. However, at lower magnetic-field strengths, the inclusion of Maxwell's equations may also be useful, e.g., when modeling an MR scanner and/or the RF coils. Note that the equations of the optimization problem may be solved using an integral equation or a partial differential equation-based solver, a neural network, etc.

By formulating the tensor field mapping as an optimization problem, improved and more accurate solutions for material parameters (such as $T_1$, $T_2$, densities of one or more types of nuclei, diffusion parameters, the permittivity, the conductivity, etc.) may be obtained, and the convergence time may be reduced (relative to other techniques) with the help of one or more regularization terms or constraints.

As an illustration, tensor field mapping may be used to determine parameters of voxels based on MRI measurements. Notably, a field of view in which a sample is placed (e.g., $20\times20\times10$ cm$^3$) may be numerically discretized into 3D voxels with a given resolution (e.g., $2\times2\times2$ mm$^3$). Each voxel may be assumed to have a set of physical properties that are related to the corresponding sample. Moreover, the Bloch equations may be used to model the magnetizations of the hydrogen protons in the voxels. The Bloch equations may be parameterized in terms of the physical properties of the sample (e.g. proton density, $T_1$, $T_2$, etc.) which are constant in each voxel, and which may allow the time evolution of the magnetization at each voxel to be estimated in response to the applied time-varying electromagnetic fields.

Based on the MR scanner or system design (such as the frequency of operation, the geometry and position of the electromagnetic coils with respect to the sample, etc.), Maxwell's equations may be used to generate detailed numerical models of the magnet, the gradient coil, the RF coil and the RF pickup coil (e.g., using surface and volume integral equation techniques). These numerical models may allow the applied currents to be converted into electromagnetic fields at each of the voxels in the field of view, which can be parameterized in terms of physical properties of the sample (e.g., the permittivity and the conductivity) at each voxel.

The forward model may be formed by coupling the numerical electromagnetic model of the system with the discretized Bloch equations. A set of initial values for the physical properties of the voxels (an initial guess) may be assumed, e.g., a constant value for all the voxels (e.g., proton density of 1, $T_1$ of 300 ms, $T_2$ of 2000 ms, etc.). The system (such as the MRI scanner) may be excited with an applied external magnetic field and a given pulse sequence (such as temporal sequence of excitation currents during 300 ms), which may be used to drive the gradient and the RF coils. Note that these electrical signals (including non-idealities due to the system electronics) may be recorded or captured.

Moreover, the recorded electrical signals may be used as inputs to perform a numerical simulation of the forward model. For example, the time duration of the pulse sequence may be discretized in small time intervals (e.g., 1 μs) and, at each time interval, the electromagnetic fields in the voxels may be computed based on the Maxwell equations and using the recorded electrical signals as excitations of the system. These time-varying electromagnetic fields may be used as inputs in a time-integration of the Bloch equations and/or a neural network to compute the magnetization of the protons in the voxels for each time interval. Using the electromagnetic models of the receive coils, these simulated magnetizations may be translated into simulated received electrical signals. During these simulations, the sensitivities of the magnetization of the voxels with respect to the inferred physical properties (such as $T_1$, $T_2$, densities of hydrogen protons, diffusion parameters, the permittivity, the conductivity, etc.) may also be computed.

The electrical signal measured at the MR scanner and the simulated electrical signal, along with the sensitivities of the magnetization of the voxels with respect to the sample properties, may be used in an iterative nonlinear optimization solver to update the values of the estimated physical properties for each voxel (and, thus, for the forward model).

This process may be repeated with a different pulse sequence to improve the estimation of the model parameters. If the numerical simulation is fast enough, the update of the physical properties of each voxel can be overlapped with the next pulse sequence transmission and measurement in the MR scanner.

The tensor field mapping may generate an output with 3×N dimensions for each voxel and each time interval: 3 spatial and N parameter dimensions that can be a combination of vector and/or scalar quantities. Moreover, for each time interval, tensor field mapping can use the captured electrical signals from the system (which may include both inputs, outputs, sensor readings and/or historical information about an object, e.g., medical records, previous MR measurements, etc.) to determine the 3×N tensor field map. In some embodiments, tensor field mapping may select a set of excitations that may improve the quality of the 3×N output in the next iteration. In this context, note that quality may mean improved fits of existing model parameters from one or more previous iterations (e.g., with a lower error rate) or it may entail solving for different model parameters. In the limit as the time interval between excitations and reconstructions approaches zero, the output may become a continuous stream. In addition to being able to solve for model parameters more quickly, this approach may allow scanning of a live organism that is dynamic or an ongoing chemical reaction.

In embodiments where there are iterations, the model parameters determining in a given iteration may be used as inputs in the next or subsequent excitation or iteration. This may improve the accuracy of the signal reconstruction and may reduce the convergence time. For example, if proton density was solved for in one of the prior iterations, the proton density can be used as an input when solving for $T_1$ and $T_2$ (thereby decoupling the linear and the nonlinear equations), and an optimal pulse sequence for measuring $T_1$ and $T_2$ can be designed, generated or selected for use in the next iteration. The model parameters may also be solved for in parallel for each time interval using GPUs, parallel processing and/or cloud computing. After the next iteration, the previously used proton density can be recomputed using the new $T_1$ and $T_2$ estimates (from that iteration) to refine the proton density and to reduce coupling effects between proton density and $T_1$ and $T_2$.

Additionally, as model parameters are determined, it may become easier to fit models and to solve for the other model parameters. In the case of external magnetic field, an initial approximation may be obtained from measurements for a few points in space by integrating or including magnetometers into the receive coil geometry. For example, the parameters that can be measured may include: electromagnetic gradients (such as gradient pulse waveforms, gradient channel profiles, e.g., spatial electromagnetic field distributions, etc.), mechanical gradients (such as gradients with respect to phase, rotation and/or position), the external magnetic field profile (which may be time varying), the gradient profile, the receive coil geometry and location (with respect to other parts of system), RF coil geometry and location (with respect to other parts of system), receive channel(s) waveforms (electromagnetic and/or mechanical), transmit channel(s) waveforms (electromagnetic and/or mechanical), and/or the location of the sample (with respect to other parts of the system and/or time).

In order to improve the signal time/phase synchronization, and to generate a coherent reconstruction using multiple signals, a 'heartbeat' or reference pattern of pulses may be embedded into the transmitted waveform pulse. This heartbeat may include sporadic impulses, randomly generated impulses, periodic impulses and/or may be a carrier wave that can be modulated into the excitation waveforms (e.g., RF waveforms or mechanical excitations, such as ultrasound pulses or another type of mechanical excitation). These pulses can be detected in the received signal, and may assist in aligning the phase and timing of the different transmit channels, whether or not all of the transmit channels are synchronized to a common clock (because of finite sampling rates).

The tensor field mapping may use additional information provided from other sources, such as the physical edges of surfaces from optical images, sonic images, infrared measurements of surface temperature readings, location of the sample as a function of time, etc. As noted previously, in conjunction with Maxwell's equations, the Pennes equations, thermodynamics, etc., tensor field mapping may generate boundary conditions, may improve the speed of convergence, and may reduce the error rate of the converged solution(s).

In some embodiments, the computations in tensor field mapping may be used to solve another inverse problem, in which, given a volume of space and a sample, hardware for extracting a set of model parameters that minimizes costs is determined. For example, machine-learning or artificial intelligence techniques may be used to design sample-specific hardware or to design a specific hardware device for measuring a specific condition in a sample, such as, detecting calcium in heart tissue. In some embodiments, machine-learning techniques such as a GAN or deep learning may be used to approximately solve these inverse problems or to compute excitations for use in each iteration. Using a forward model to compute model parameters, the system can use the forward model to develop a GAN that can be used to train a neural network. This approach may result in a very accurate, scalable forward model and can generate an enormous amount of synthetic or simulated training data very quickly. This simulated data may be used to train a deep-learning model.

Note that tensor field mapping may allow the use of non-ideal hardware. This may allow the use of cheaper systems that can measure parameters in parallel with higher spatial-temporal resolution, and with improved quantitative reproducibility. Moreover, instead of eliminating or ignoring non-ideal behavior, tensor field mapping may exploit them to improve the performance, and this can be considered when designing hardware to improve the performance while reducing the cost of hardware for performing quantitative spatial-temporal measurements.

Because the tensor field mapping or the characterization technique may not involve a Fourier transform of, e.g., measurements may be performed in the time domain, in some embodiments reduced or variable (non-constant) sampling may be used.

Note that Fourier transform-based reconstruction may rely on encoding each position of the field of view (such as a voxel) with a given (fixed) frequency and phase of the signal. The Fourier-transform sampling may be performed to form a uniform lattice that samples the 2D or 3D k-space (i.e., the spatial frequency domain) on those frequency and phase positions. Then, a unitary transformation (with condition number 1) may be applied to obtain the image from these samples (e.g., by mapping the weighting coefficients of the frequencies and phases that form the signal into the voxels in the image). MRI systems can use additional techniques to reduce sampling of k-space and to perform non-uniform Fourier transform and regularization-based reconstruction (e.g., total variation, low-rank and sparse matrix). However, Fourier-transform techniques are usually unable to incorporate information about system non-idealities. Instead, in these Fourier-transform techniques, it is usually assumed that the system is ideal, which may discard information, increase the acquisition time, cost, storage, processing time, etc. Moreover, the captured samples may be unnecessarily redundant because of symmetries. Furthermore, existing Fourier transform-based MRI system often rely on hardware that is presumed ideal and that the pulse sequences are ideal, and ignores imperfections of the transmitted excitation and the magnetic gradients. In some embodiments, tensor field mapping may be used to simulate or emulate MRI by reducing the number of model parameters and using ideal waveforms (instead of non-ideal waveforms after the waveform signal has passed through a non-ideal amplifier). Alternatively, tensor field mapping may be used to simulate the spin evolutions of each voxel based on the available information (system imperfections, estimated material properties, excitation signals received at each position in space, etc.), and the model parameters can be estimated so that the combination of the magnetization signals of all the voxels matches the measured signal(s).

The use of non-ideal waveforms (such as measured waveforms) may make the inverse problem in the tensor field mapping or characterization technique better conditioned (e.g., it may reduce the condition number) because it incorporates the imperfections in the hardware. In turn, reconstruction from such recorded pulse sequences or waveforms may allow the use of non-ideal hardware and may simplify the reconstruction process and/or may improve the quality of the reconstruction. For example, non-ideal hardware may allow electrical signals to be identified and associated with a unique signature of noise from particular hardware, to detect when hardware may be about to fail, and/or may provide dithering effects during signal reconstruction.

As noted previously, one or more of Maxwell's equations may be used as a constraint during the tensor field mapping or characterization technique. For example, there may be three types of electromagnetic waves present during MRI measurements: the magneto-static wave (which is sometimes referred to as the 'external magnetic field'), the quasi-static wave (which is sometimes referred to as the electromagnetic 'gradient'), and the RF wave (or RF pulse). The magneto-static wave may have zero frequency and is purely a magnetic field. It may be generated by an external magnet (such as a superconducting magnet). The quasi-static fields (having fundamental frequencies typically up to a few kilohertz) may be generated by the gradient coils, and the RF waves (having fundamental frequencies typically of tens or hundreds of megahertz depending on the strength of the external magnet) may be transmitted and received by (near-field) antennas (or RF coils).

The external magnet may align the magnetic dipoles of the sample and may create the bulk magnetization that generates the signal that is detected in the MR scanner when 'interrogated' with RF pulses. However, the distribution of the magneto-static magnetic field may be perturbed because of interactions between the external magnet and the magnetic susceptibility of the sample. In MRI measurements, these perturbations can result in artifacts in the reconstructed image, especially for pulse sequences that are based on the so-called 'refocused gradient echo technique'. Nonetheless, the perturbations are also an opportunity for reconstructing the susceptibility properties of the sample, which may be clinically useful.

If a magneto-static simulator is included in the analysis, the tensor field mapping technique can account for these effects. Notably, in some embodiments, a magneto-static simulator may be used to compute the perturbation of the magnetic flux density from a given magnetic susceptibility distribution in an initial magnetic flux field. For example, the magneto-static simulator may include or use an integral equation technique for computational electromagnetics. In some embodiments, a volume integral form of the integral equation may allow modeling of heterogeneous volumetric materials, e.g., biological tissue properties.

In order to numerically solve the magneto-static problem, the sample may be discretized into a grid or matrix of cubic voxels, where each voxel has a homogeneous magnetic susceptibility distribution. For example, depending on the desired resolution the voxels may be 1-3 mm$^3$, and there may be 128×128×128, 196×196×196 or 256×256×256 voxels.

Then, the method of moments may be used to solve this integral equation for a given initial magnetic flux field. Because a uniform voxel grid is used to represent the volumetric domain, fast computational techniques (such as the fast Fourier transform or FFT) may be used for accelerating the most computationally expensive part of the magneto-static solution (notably, the matrix vector products in every iteration of a linear systems iterative solver, such as a minimal residual method, a conjugate gradient method, etc.).

For example, a constant or homogeneous susceptibility may initially be used throughout the volume (such as when there is no prior information for the sample under test). The magnetic susceptibility in the sample may be on the order of parts per million (ppm), and typically it varies between −15 and 5 ppm in different voxels (e.g., the voxels may be mostly diamagnetic). Interfaces between diamagnetic regions or voxels and air (which is slightly paramagnetic) can be challenging. Note that, while the susceptibility values may seem small, the profiles across different voxels are typically distinct for various types of tissues and pathologies. Indeed, tiny variations like these are the basis of MRI in the first place and also explain why strong external magnetic fields (on the order of 1 T) are usually needed to have recordable signals. Moreover, the homogeneity of the external magnetic field in an MRI is typically 1 ppm. The perturbations associated with the variations in magnetic susceptibility scale with the external magnetic field strength, and thus can be up to two orders of magnitude larger for strong external magnetic fields (and, thus, can be significant).

Quantitative susceptibility mapping (QSM) is a type of contrast mechanism in MRI in which the determined voxel intensity is linearly proportional to the apparent magnetic susceptibility of the underlying tissue, is often determined by quantifying the susceptibility relative to, e.g., a reference material such as cerebrospinal fluid (which is assumed to have the same susceptibility as water, but depending on pathology or other factors may not be correct). Tensor field mapping with magnetostatics is able to determine the absolute (quantitative) susceptibility (as opposed to, e.g., relative to a reference material). As described further below, this capability allows the magnetic susceptibility to be extracted as an extra parameter that regularizes the spin dynamics. In some embodiments, the ability to quantitatively determine the absolute magnetic susceptibility may be used to relax constraints on hardware. Notably, existing MR scanners do not have an ability to account for magnetic-field variations (magneto-static, quasi-static or RF). Instead, the magnetic-field variations are labelled as artifacts. Moreover, the ability to quantitatively determine the absolute magnetic susceptibility may allow the use of pulse sequences that are short (and, thus, very fast) but are sensitive to magnetic susceptibility and/or magnetic-susceptibility-induced artifacts (such as artifacts associated with geometric warping at tissue-air interfaces or due to implants in the human body). For example, the pulse sequence may include an echo-planar imaging sequence run on the human body.

The combination of the spin-dynamics (for the spin dynamics governed by, e.g., the Bloch equations), the magneto-static simulator (for the magneto-static fields governed by Maxwell's equations) and one or more regularization techniques (such as L1-normalization, L2-normalization, total variation, Hessian, etc.) can be used to significantly improve the generation of multi-parametric, quantitative maps of model parameters for samples, such as for biological tissue. Notably, an optimization technique based on the magneto-static simulator and the one or more regularization techniques can be used as a standalone tool for reconstructing magnetic susceptibility maps given the perturbed magneto-static fields obtained by post-processing the phase maps of spin-dynamics reconstructions. Moreover, the reconstructed susceptibility maps can be fed back to the spin-dynamics reconstructions to improve the quality of the reconstruction of the spin-dynamics model parameters ($T_1$, $T_2$, proton density, etc.). Furthermore, a synergetic technique may be used, in which the magneto-static-based reconstruction is used as an extra regularizer for the spin dynamic-based reconstruction in an alternating fashion in consecutive iterations. This synergetic technique may reduce or eliminate artifacts in reproducible maps of spin-dynamics and magneto-static model parameters. Additionally, the synergetic technique may allow more aggressive pulse sequence optimization (such as faster signal acquisition), and may significantly lower or reduce the hardware constraints (such as the homogeneity of the magnetic field maps). This may reduce the cost of an MR scanner.

Thus, the system may provide a way to capture, in real-time or near real-time, higher-order hybrid tensors or matrices at each voxel in 3D space. Using electromagnetic and/or mechanical perturbations or excitations, the system may use different characterization techniques to measure disturbances and responses, and then to simulate the responses.

The result of this characterization may be a (4+N)D (three spatial dimensions, one time dimension, and up to N parameter dimensions at each point in space) quantitative model of the volume being scanned. Note that the (4+N)D quantitative model may be projected onto an arbitrary subset of the full (4+N)D space, including 2D or 3D images.

In some embodiments, the use of multidimensional data and models provides enhanced diagnostic accuracy (i.e., a lower false-positive rate) relative to conventional MRI approaches, even if a larger voxel size is used. Thus, the computation technique may allow improved diagnostic accuracy with a larger voxel size (or a weaker external magnetic field) than would be needed in conventional MRI. However, as noted previously, the computation technique may be used with a wide variety of measurement techniques separately from or in addition to MRI.

Figure 7:
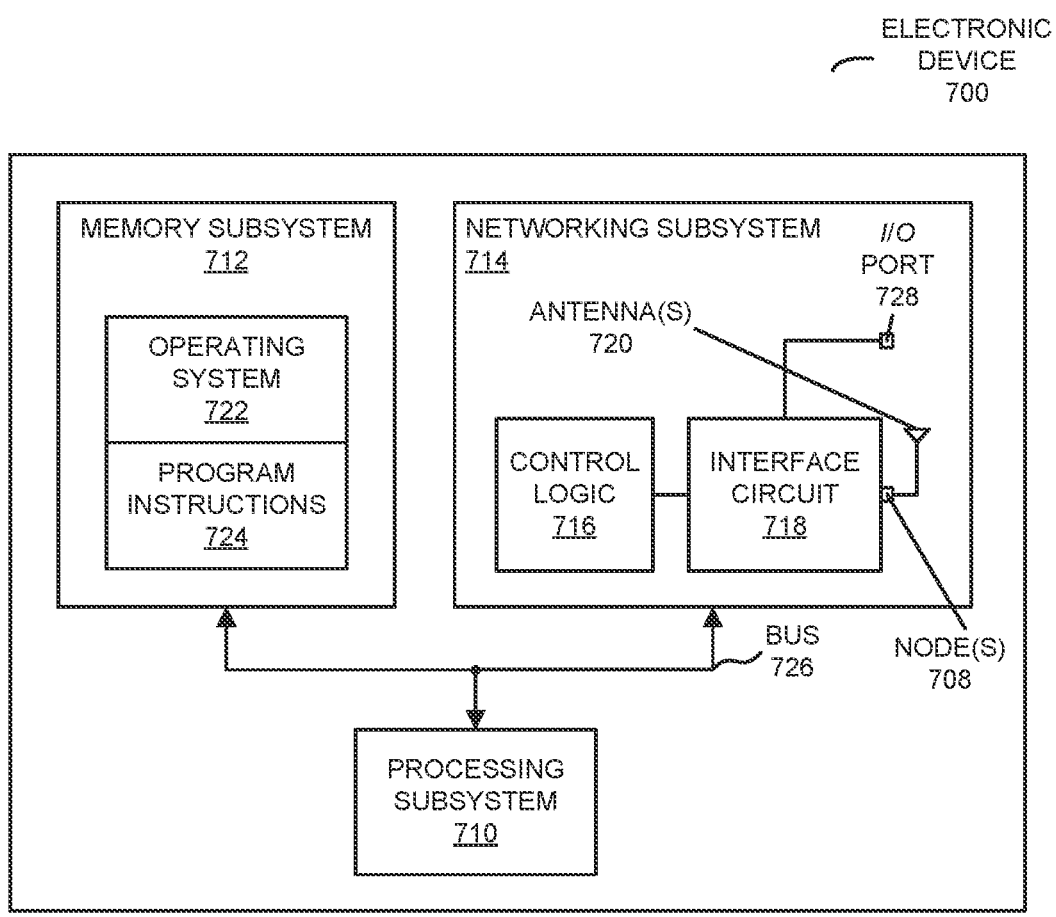
FIG. 7 is a block diagram illustrating an example of an electronic device in accordance with an embodiment of the present disclosure.

We now further describe an electronic device that performs at least some of the operations in the computation technique. FIG. 7 presents a block diagram illustrating an electronic device 700 in system 100 (FIG. 1), such as computer 116 (FIG. 1) or another of the computer-controlled components in system 100, such as source 110 or measurement device 114 (FIG. 1). This electronic device includes a processing subsystem 710, memory subsystem 712, and networking subsystem 714. Processing subsystem 710 may include one or more devices configured to perform computational operations and to control components in system 100 (FIG. 1). For example, processing subsystem 710 may include one or more microprocessors or central processing units (CPUs), one or more graphics processing units (GPUs), application-specific integrated circuits (ASICs), microcontrollers, programmable-logic devices (such as a field programmable logic array or FPGA), and/or one or more digital signal processors (DSPs).

Memory subsystem 712 may include one or more devices for storing data and/or instructions for processing subsystem 710 and networking subsystem 714. For example, memory subsystem 712 may include dynamic random access memory (DRAM), static random access memory (SRAM), and/or other types of memory. In some embodiments, instructions for processing subsystem 710 in memory subsystem 712 include one or more program modules or sets of instructions (such as program instructions 724), which may be executed in an operating environment (such as operating system 722) by processing subsystem 710. Note that the one or more computer programs may constitute a computer-program mechanism or a program module (i.e., software). Moreover, instructions in the various modules in memory subsystem 712 may be implemented in: a high-level procedural language, an object-oriented programming language, and/or in an assembly or machine language. Furthermore, the programming language may be compiled or interpreted, e.g., configurable or configured (which may be used interchangeably in this discussion), to be executed by processing subsystem 710.

In addition, memory subsystem 712 may include mechanisms for controlling access to the memory. In some embodiments, memory subsystem 712 includes a memory hierarchy that comprises one or more caches coupled to a memory in electronic device 700. In some of these embodiments, one or more of the caches is located in processing subsystem 710.

In some embodiments, memory subsystem 712 is coupled to one or more high-capacity mass-storage devices (not shown). For example, memory subsystem 712 may be coupled to a magnetic or optical drive, a solid-state drive, or another type of mass-storage device. In these embodiments, memory subsystem 712 may be used by electronic device 700 as fast-access storage for often-used data, while the mass-storage device is used to store less frequently used data.

In some embodiments, memory subsystem 712 includes a remotely located archive device. This archive device can be a high-capacity network attached mass-storage device, such as: network attached storage (NAS), an external hard drive, a storage server, a cluster of servers, a cloud-storage provider, a cloud-computing provider, a magnetic-tape backup system, a medical records archive service, and/or another type of archive device. Moreover, processing subsystem 710 may interact with the archive device via an application programming interface to store and/or access information from the archive device.

Note that memory subsystem 712 and/or electronic device 700 may be compliant with the Health Insurance Portability and Accountability Act.

Figure 8:
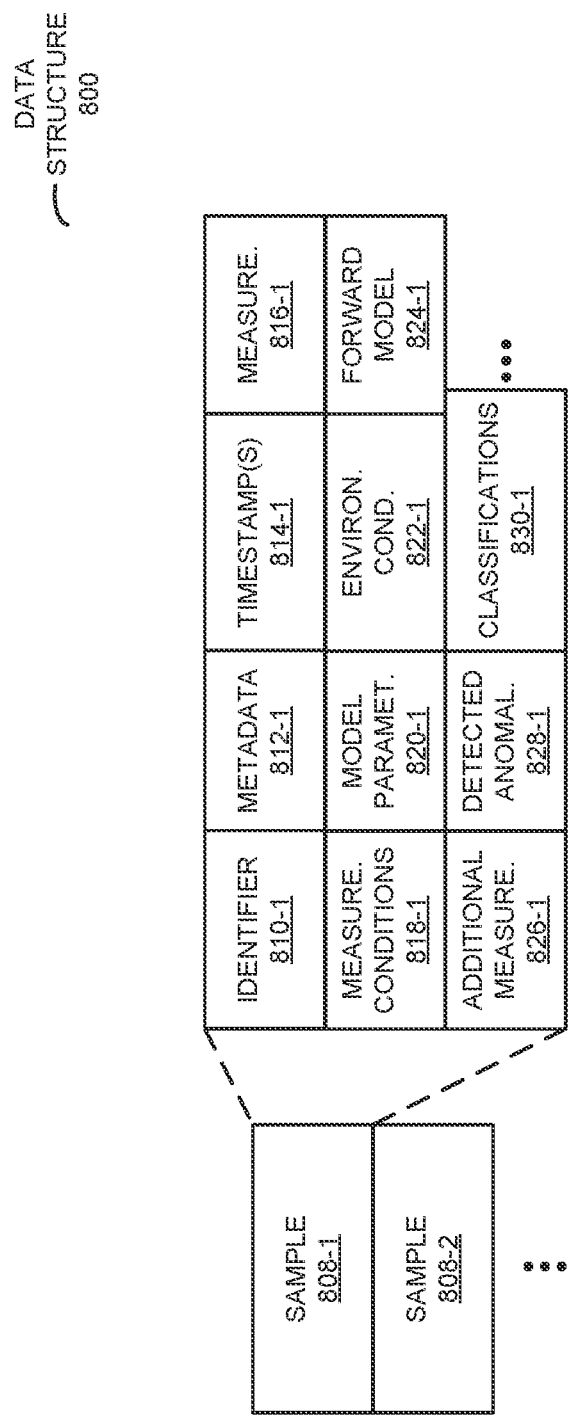
FIG. 8 is a drawing illustrating an example of a data structure that is used by the electronic device of FIG. 7 in accordance with an embodiment of the present disclosure.

An example of the data stored (locally and/or remotely) in memory subsystem 712 is shown in FIG. 8, which presents a drawing illustrating an example of a data structure 800 that is used by electronic device 700 (FIG. 7). This data structure may include: an identifier 810-1 of sample 808-1 (such as an individual), metadata 812 (such as age, gender, biopsy results and diagnosis if one has already been made, other sample information, demographic information, family history, etc.), timestamps 814 when data was acquired, received measurements 816 (such as MR signals and, more generally, raw data), excitation and measurement conditions 818 (such as an external magnetic field, an optional gradient, an RF pulse sequence, an MR apparatus, a location, machine-specific characteristics such as magnetic-field inhomogeneity, RF noise and one or more other system imperfections, signal-processing techniques, registration information, synchronization information such between measurements and a heartbeat or breathing pattern of an individual, etc.), and/or determined model parameters 820 (including voxel sizes, speed, resonant frequency or a type of nuclei, $T_1$ and $T_2$ relaxation times, segmentation information, classification information, etc.), environmental conditions 822 (such as the temperature, humidity and/or barometric pressure in the room or the chamber in which sample 808-1 was measured), forward model 824, one or more additional measurements 826 of physical properties of sample 808-1 (such as weight, dimensions, images, etc.), optional detected anomalies 828 (which may include particular voxel(es) associated with the one or more of detected anomalies 828), and/or optional classifications 830 of the one or more detected anomalies 828. Note that data structure 800 may include multiple entries for different measurements.

In one embodiment, data in data structure 800 is encrypted using a block-chain or a similar cryptographic hash technique to detect unauthorized modification or corruption of records. Moreover, the data can be anonymized prior to storage so that the identity of an individual associated with a sample is anonymous unless the individual gives permission or authorization to access or release the individual's identity.

Referring back to FIG. 7, networking subsystem 714 may include one or more devices configured to couple to and communicate on a wired, optical and/or wireless network (i.e., to perform network operations and, more generally, communication), including: control logic 716, an interface circuit 718, one or more antennas 720 and/or input/output (I/O) port 728. (While FIG. 7 includes one or more antennas 720, in some embodiments electronic device 700 includes one or more nodes 708, e.g., a pad or connector, which can be coupled to one or more antennas 720. Thus, electronic device 700 may or may not include one or more antennas 720.) For example, networking subsystem 714 can include a Bluetooth networking system (which can include Bluetooth Low Energy, BLE or Bluetooth LE), a cellular networking system (e.g., a 3G/4G network such as UMTS, LTE, etc.), a universal serial bus (USB) networking system, a networking system based on the standards described in IEEE 802.11 (e.g., a Wi-Fi networking system), an Ethernet networking system, and/or another networking system.

Moreover, networking subsystem 714 may include processors, controllers, radios/antennas, sockets/plugs, and/or other devices used for coupling to, communicating on, and handling data and events for each supported networking system. Note that mechanisms used for coupling to, communicating on, and handling data and events on the network for each network system are sometimes collectively referred to as a 'network interface' for network subsystem 714.

Moreover, in some embodiments a 'network' between components in system 100 (FIG. 1) does not yet exist. Therefore, electronic device 700 may use the mechanisms in networking subsystem 714 for performing simple wireless communication between the components, e.g., transmitting advertising or beacon frames and/or scanning for advertising frames transmitted by other components.

Within electronic device 700, processing subsystem 710, memory subsystem 712, networking subsystem 714 may be coupled using one or more interconnects, such as bus 726. These interconnects may include an electrical, optical, and/or electro-optical connection that the subsystems can use to communicate commands and data among one another. Although only one bus 726 is shown for clarity, different embodiments can include a different number or configuration of electrical, optical, and/or electro-optical connections among the subsystems.

Electronic device 700 may be (or can be) included in a wide variety of electronic devices. For example, electronic device 700 may be included in: a tablet computer, a smartphone, a smartwatch, a portable computing device, a wearable device, test equipment, a digital signal processor, a cluster of computing devices, a laptop computer, a desktop computer, a server, a subnotebook/netbook and/or another computing device.

Although specific components are used to describe electronic device 700, in alternative embodiments, different components and/or subsystems may be present in electronic device 700. For example, electronic device 700 may include one or more additional processing subsystems, memory subsystems, and/or networking subsystems. Additionally, one or more of the subsystems may not be present in electronic device 700. Moreover, in some embodiments, electronic device 700 may include one or more additional subsystems that are not shown in FIG. 7.

Although separate subsystems are shown in FIG. 7, in some embodiments, some or all of a given subsystem or component can be integrated into one or more of the other subsystems or components in electronic device 700. For example, in some embodiments program instructions 724 are included in operating system 722. In some embodiments, a component in a given subsystem is included in a different subsystem. Furthermore, in some embodiments electronic device 700 is located at a single geographic location or is distributed over multiple different geographic locations.

Moreover, the circuits and components in electronic device 700 may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

An integrated circuit may implement some or all of the functionality of networking subsystem 714 (such as a radio) and, more generally, some or all of the functionality of electronic device 700. Moreover, the integrated circuit may include hardware and/or software mechanisms that are used for transmitting wireless signals from electronic device 700 and receiving signals at electronic device 700 from other components in system 100 (FIG. 1) and/or from electronic devices outside of system 100 (FIG. 1). Aside from the mechanisms herein described, radios are generally known in the art and hence are not described in detail. In general, networking subsystem 714 and/or the integrated circuit can include any number of radios. Note that the radios in multiple-radio embodiments function in a similar way to the radios described in single-radio embodiments.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both.

In addition, in some of the preceding embodiments there are fewer components, more components, a position of a component is changed and/or two or more components are combined.

While the preceding discussion illustrated the computation technique to solve a vector wave equation, in other embodiments the computation technique may be used to solve a scalar equation. For example, an acoustic wave equation may be solved in an arbitrary inhomogeneous media based on ultrasound measurements using a forward model. (Thus, in some embodiments the excitation may be mechanical.) Note that the acoustic coupling in ultrasound measurements can dependent on the operator (i.e., the ultrasound measurements may be pressure dependent). Nonetheless, a similar approach may be used to: improve ultrasound imaging, determine 3D structure, facilitate improved presentation, etc.

In the preceding description, we refer to 'some embodiments.' Note that 'some embodiments' describes a subset of all of the possible embodiments, but does not always specify the same subset of embodiments. Moreover, note that numerical values in the preceding embodiments are illustrative examples of some embodiments. In other embodiments of the computation techniques, different numerical values may be used.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A method for determining model parameters associated with a sample, comprising operations of:
    applying, to the sample, an excitation using a source, wherein the excitation comprises or corresponds to one or more of: electromagnetic radiation, a radio-frequency wave, a particle beam, a sound wave, an external magnetic field, or an electric field;
    measuring, using a measurement device, a response associated with the sample to the excitation;
    computing, using an inverse model or a predetermined predictive model, which has the measured response and information specifying the excitation as inputs, the model parameters on a voxel-by-voxel basis in a forward model with multiple voxels that represent the sample,
    wherein the predetermined predictive model was trained, prior to the applying and the measuring, using training data for different excitation strengths, different measurement conditions or both,
    wherein the model parameters comprise magnetic susceptibilities of the multiple voxels,
    wherein the forward model simulates response physics occurring within the sample to the excitation, and
    wherein the forward model is a function of the excitation, the model parameters of the multiple voxels, and differential or phenomenological equations that approximates the response physics;
    determining, using a computer, an accuracy of the model parameters by comparing at least the measured response and a calculated predicted value of the response using the forward model, the model parameters and the excitation; and
    providing, when the accuracy exceeds a predefined value, the model parameters to an electronic device, to a display or to memory.

2. The method of claim 1, wherein the excitation has at least a wavelength and an intensity or a flux.

3. The method of claim 1, wherein the forward model simulates the response physics occurring within the sample to a given wavelength and a given intensity or a given flux that are selected from a range of measurement conditions that comprise the excitation.

4. The method of claim 1, wherein the predetermined predictive model comprises one of: a machine-learning model, or a neural network.

5. The method of claim 1, wherein, when the accuracy exceeds the predefined value, the model parameters are computed in a single pass without further iteration.

6. The method of claim 1, wherein, when the computing uses the inverse model, the computing comprises iteratively repeating the applying, measuring, computing and determining operations with at least a second excitation instead of the excitation and that is different from the excitation.

7. The method of claim 1, wherein, when the accuracy is less than the predefined value, the method comprises:
    adding the excitation and the measured response to a training dataset; and
    determining, using the training dataset, a revised instance of the predictive model.

8. The method of claim 1, wherein the method comprises training the predictive model using a simulated dataset computed using the forward model, a range of model parameters and a range of excitations.

9. The method of claim 1, wherein the forward model comprise a magneto-static simulator configured to simulate perturbations to the external magnetic field associated with the magnetic susceptibilities of the multiple voxels.

10. The method of claim 9, wherein the magneto-static simulator computes a solution to an integral equation.

11. The method of claim 10, wherein the magneto-static simulator is configured to compute the solution using a method of moments.

12. The method of claim 10, wherein the magnetic susceptibilities of the multiple voxels are initially assumed to have a constant value and the magneto-static simulator is configured to compute the solution using a Fourier transform.

13. The method of claim 1, wherein the magnetic susceptibilities of the multiple voxels comprise absolute susceptibilities that are computed without use of a reference material.

14. The method of claim 1, wherein a subset of the model parameters is associated with spin dynamics and the magnetic susceptibilities of the multiple voxels are used to regularize the spin dynamics in the computing operation.

15. The method of claim 1, wherein the magnetic susceptibilities of the multiple voxels reduce or eliminate artifacts in a remainder of the model parameters that are associated with the magnetic susceptibilities.

16. The method of claim 1, wherein the measured response comprises a time-domain response of the sample and is other than an image.

17. A non-transitory computer-readable storage medium for use in conjunction with a computer system, the computer-readable storage medium configured to store program instructions that, when executed by the computer system, cause the computer system to perform operations comprising:
   applying, to a sample, an excitation using a source, wherein the excitation comprises or corresponds to one or more of: electromagnetic radiation, a radio-frequency wave, a particle beam, a sound wave, a magnetic field, or an electric field;
   measuring, using a measurement device, a response associated with the sample to the excitation;
   computing, using an inverse model or a predetermined predictive model, which has the measured response and information specifying the excitation as inputs, model parameters on a voxel-by-voxel basis in a forward model with multiple voxels that represent the sample,
   wherein the predetermined predictive model was trained, prior to the applying and the measuring, using training data for different excitation strengths, different measurement conditions or both,
   wherein the model parameters comprise magnetic susceptibilities of the multiple voxels,
   wherein the forward model simulates response physics occurring within the sample to the excitation, and
   wherein the forward model is a function of the excitation, the model parameters of the multiple voxels, and differential or phenomenological equations that approximates the response physics;
   determining, using a computer, an accuracy of the model parameters by comparing at least the measured response and a calculated predicted value of the response using the forward model, the model parameters and the excitation; and
   providing, when the accuracy exceeds a predefined value, the model parameters to an electronic device, to a display or to memory.

18. The non-transitory computer-readable storage medium of claim 17, wherein the predetermined predictive model comprises one of: a machine-learning model, or a neural network.

19. A system, comprising:
   a source configured to provide an excitation, wherein the excitation comprises or corresponds to: electromagnetic radiation, a radio-frequency wave, a particle beam, a sound wave, a magnetic field, or an electric field;
   a measurement device configured to perform measurements;
   a computation device, coupled to the source, the measurement device and memory, configured to execute program instructions; and
   the memory, coupled to the computation device, configured to store the program instructions that, when executed by the computation device, cause the system to perform operations comprising:
      applying, to a sample, the excitation using the source;
      measuring, using the measurement device, a response associated with the sample to the excitation;
      computing, using an inverse model or a predetermined predictive model, which has the measured response and information specifying the excitation as inputs, model parameters on a voxel-by-voxel basis in a forward model with multiple voxels that represent the sample,
      wherein the predetermined predictive model was trained, prior to the applying and the measuring, using training data for different excitation strengths, different measurement conditions or both,
      wherein the model parameters comprise magnetic susceptibilities of the multiple voxels,
      wherein the forward model simulates response physics occurring within the sample to the excitation, and
      wherein the forward model is a function of the excitation, the model parameters of the multiple voxels, and differential or phenomenological equations that approximates the response physics;
      determining, using the computation device, an accuracy of the model parameters by comparing at least the measured response and a calculated predicted value of the response using the forward model, the model parameters and the excitation; and
      providing, when the accuracy exceeds a predefined value, the model parameters to an electronic device, to a display or to the memory.

20. The system of claim 19, wherein the predetermined predictive model comprises one of: a machine-learning model, or a neural network.

* * * * *